United States Patent [19]

Wolf et al.

[11] Patent Number: 4,937,778
[45] Date of Patent: Jun. 26, 1990

[54] SYSTEM FOR SELECTIVELY MODIFYING CODES GENERATED BY A TOUCH TYPE KEYBOARD UPON DETECTING OF PREDETERMINED SEQUENCE OF MAKE CODES AND BREAK CODES

[76] Inventors: Chris L. Wolf; Michael F. Maikowski, both of 23454 25th Ave. S., Des Moines, Wash. 98198; Winston N. Martin, 1919 Kent-De Moines Rd., #303, Des Moines, Wash. 98198; Walter E. Lindsley, Jr., Rte. 2, Box 2116, Selah, Wash. 98942

[21] Appl. No.: 853,302

[22] Filed: Apr. 14, 1986

[51] Int. Cl.$^5$ .............................................. G06F 3/03
[52] U.S. Cl. ........................... 364/900; 364/928.6; 364/948.1; 364/949.4; 364/947.5; 364/709.12; 340/711; 341/26; 400/100; 400/104
[58] Field of Search ... 364/200 MS File, 900 MS File, 364/709, 709.12; 340/365 S, 365 R, 711; 400/63, 76, 104, 109, 110, 88, 100; 341/24, 26, 23

[56] References Cited

U.S. PATENT DOCUMENTS

| | | | |
|---|---|---|---|
| 4,042,777 | 8/1977 | Bequaert et al. | 364/709.12 |
| 4,202,041 | 5/1980 | Kaplow et al. | 364/900 |
| 4,222,038 | 9/1980 | Mageri | 340/365 |
| 4,277,780 | 7/1981 | Sonderman et al. | 340/365 |
| 4,302,816 | 11/1981 | Yamamoto | 364/709 |
| 4,303,973 | 12/1981 | Williamson, Jr. et al. | 364/103 |
| 4,360,892 | 11/1982 | Endfield | 364/900 |
| 4,375,060 | 2/1983 | Horyu | 340/365 |
| 4,381,502 | 4/1983 | Prame | 340/365 |
| 4,400,697 | 8/1983 | Currie et al. | 340/711 |
| 4,431,988 | 2/1984 | Molusis et al. | 340/712 |
| 4,438,073 | 2/1985 | Fisher et al. | 364/709 X |
| 4,464,070 | 8/1984 | Hanft et al. | 400/98 |
| 4,490,056 | 12/1984 | Whitaker | 400/100 |
| 4,502,038 | 2/1985 | Lowenthal et al. | 340/365 |
| 4,502,039 | 2/1985 | Vercesi et al. | 340/365 |
| 4,604,712 | 8/1986 | Orrhammer | 364/900 |
| 4,647,911 | 3/1987 | Maegawa et al. | 340/365 S |
| 4,669,901 | 6/1987 | Feng | 400/110 |
| 4,680,710 | 7/1987 | Kizilbash | 364/419 |
| 4,680,725 | 7/1987 | Lapeyre | 364/709 |
| 4,694,280 | 9/1987 | Rollhaus et al. | 364/709.12 |

FOREIGN PATENT DOCUMENTS 2121224 12/1983 United Kingdom .

OTHER PUBLICATIONS

Begnaert, "Typmatic Feature for Chord Keyboard", IBM, vol. 22, No. 12, May, 1980, pp. 5504–5505.
Bradney et al., "Keyboard Definition Function", IBM TDB, vol. 27, No. 5, 10/1984, pp. 2992–2994.
Anzelone et al., "Mapping the Personnal Computer 83-Key Keyboard to a 62-Key Keyboard", IBM TDB, vol. 27, No. 4B, 9/84, pp. 2717–2718.

Primary Examiner—Thomas C. Lee
Attorney, Agent, or Firm—Christensen, O'Connor, Johnson & Kindness

[57] ABSTRACT

A method and apparatus for enhancing the operation of computer keyboards is disclosed. The invention allows touch-typing of nontouch-type keys by detecting a triggering sequence in the touch-type keys. For example, by holding down the Space Bar while depressing and releasing a second key and before release of the Space Bar, the Space Bar is seen to act as a Control key. Furthermore, the functions of nontouch-type keys may be superimposed upon touch-type keys and accessed in a similar manner. The invention interprets make codes which are generated by the keyboard when a key is depressed and a break code which is generated by the keyboard when a key is released. If a triggering sequence of codes is detected, then the normal function of one of the touch-type keys is altered.

15 Claims, 12 Drawing Sheets

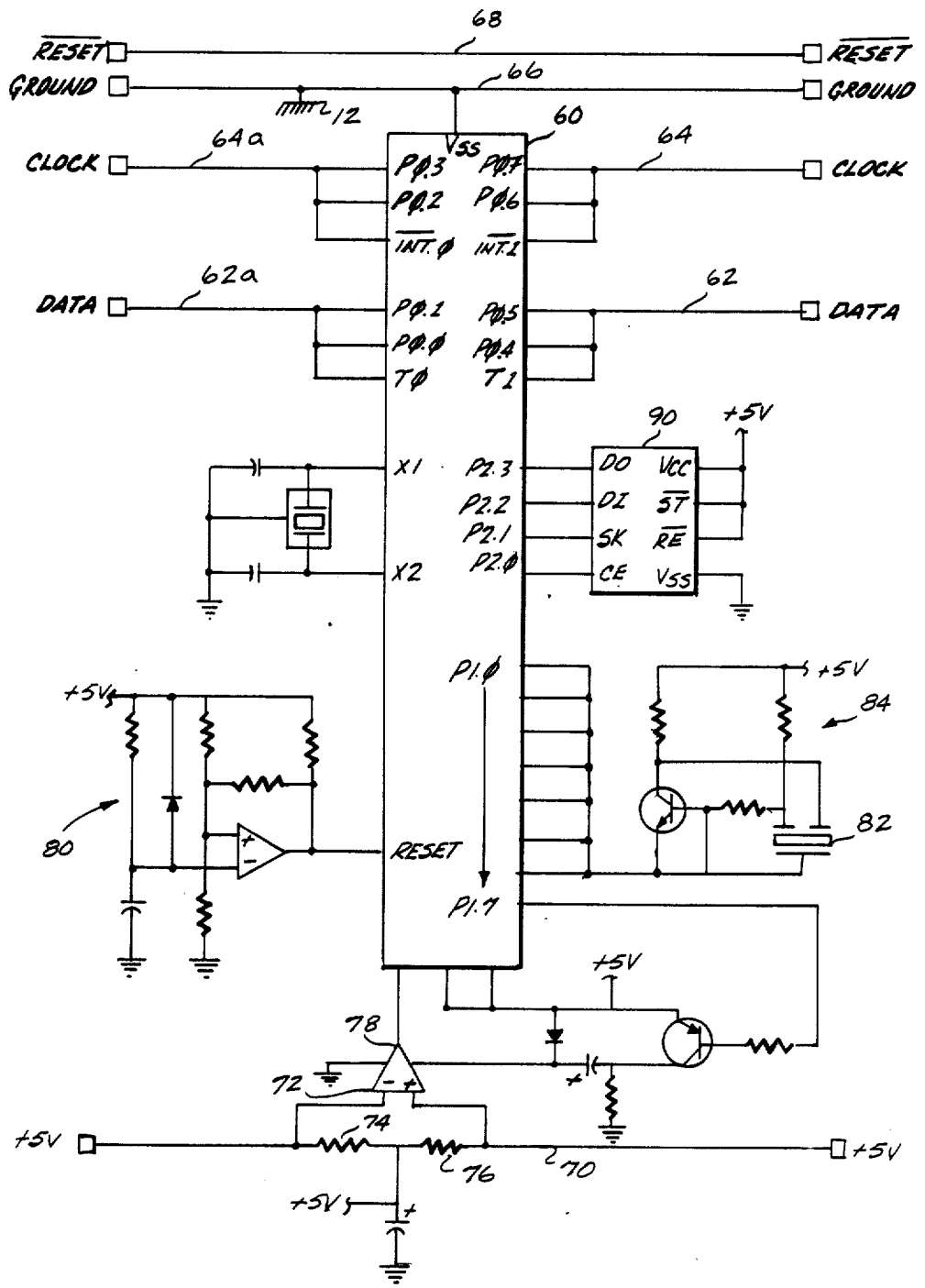

Fig. 3A.

F1  F2  F3  F4  F5        ↑  PgUp Ctrl        ↑        Del
(1) (2) (3) (4) (5)  Shift Alt            (6) (7) (8) (9) (0)
                     (q) (w) (e) (r) (t)   (y) (u) (i) (o) (p)
                     Esc  →    ↓            →
                     (a) (s) (d) (f) (g)   (h) [(j)] (k) (l) (;)
                     Home End Tab PgDn Ins BKSP
                     (\) (z) (x) (c) (v) (b)   (n) (m) (,) (.) (/)

Fig. 3B.

F6  F7  F8  F9  F10
(1) (2) (3) (4) (5)       (6) (7) (8) (9) (0)
                          7   8   9   -
(q) (w) (e) (r) (t)       (y) (u) (i) (o) (p)
         52               4   5   6   Rtrn
(a) (s) (d) [(f)] (g)     (h) (j) (k) (l) (;)
                          0   1   2   3   +
(\) (z) (x) (c) (v) (b)   (n) (m) (,) (.) (/)

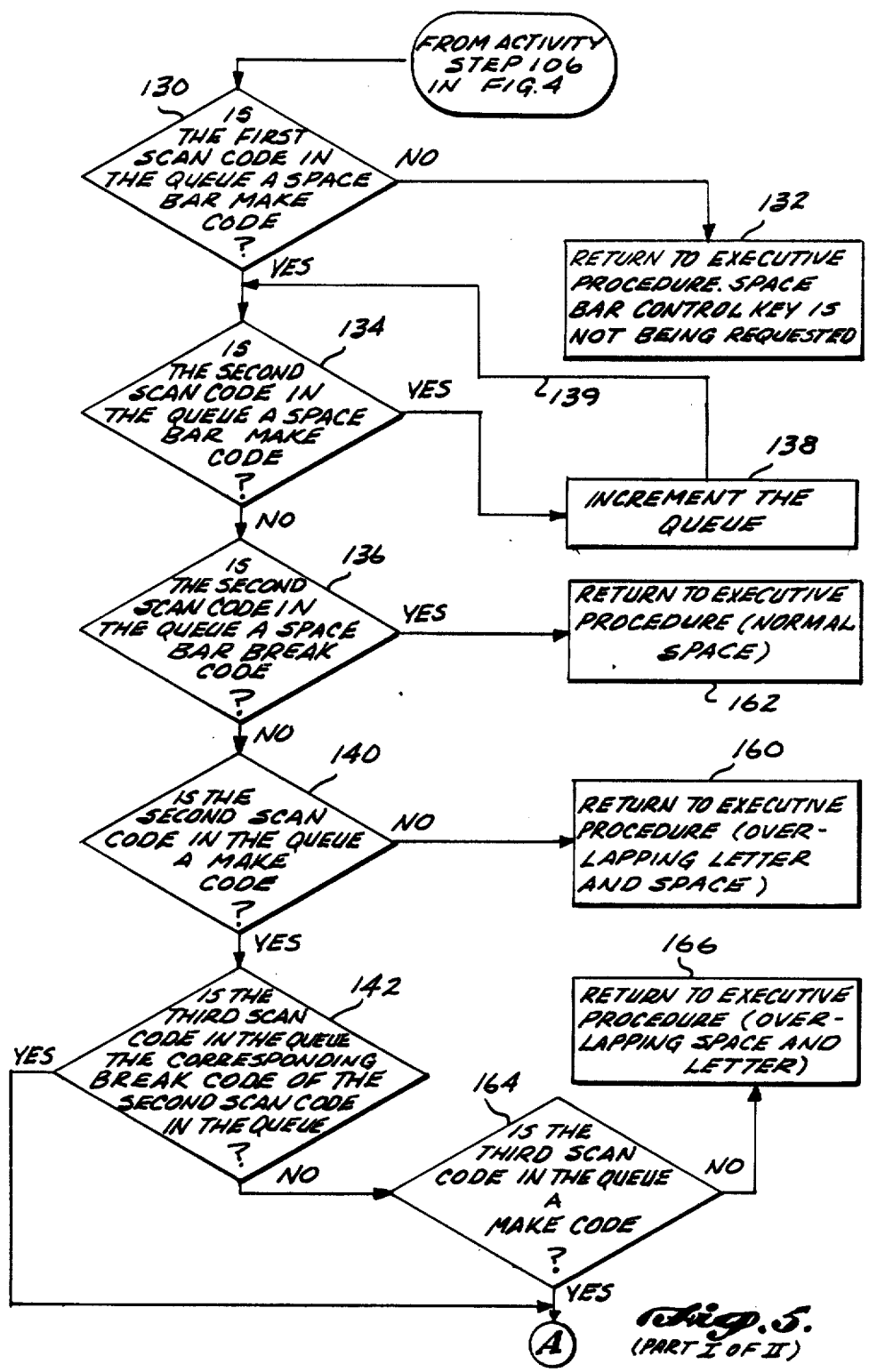
Fig. 5. (PART I OF II)

(PART II OF II)

(PART I OF V)

(PART II OF V)

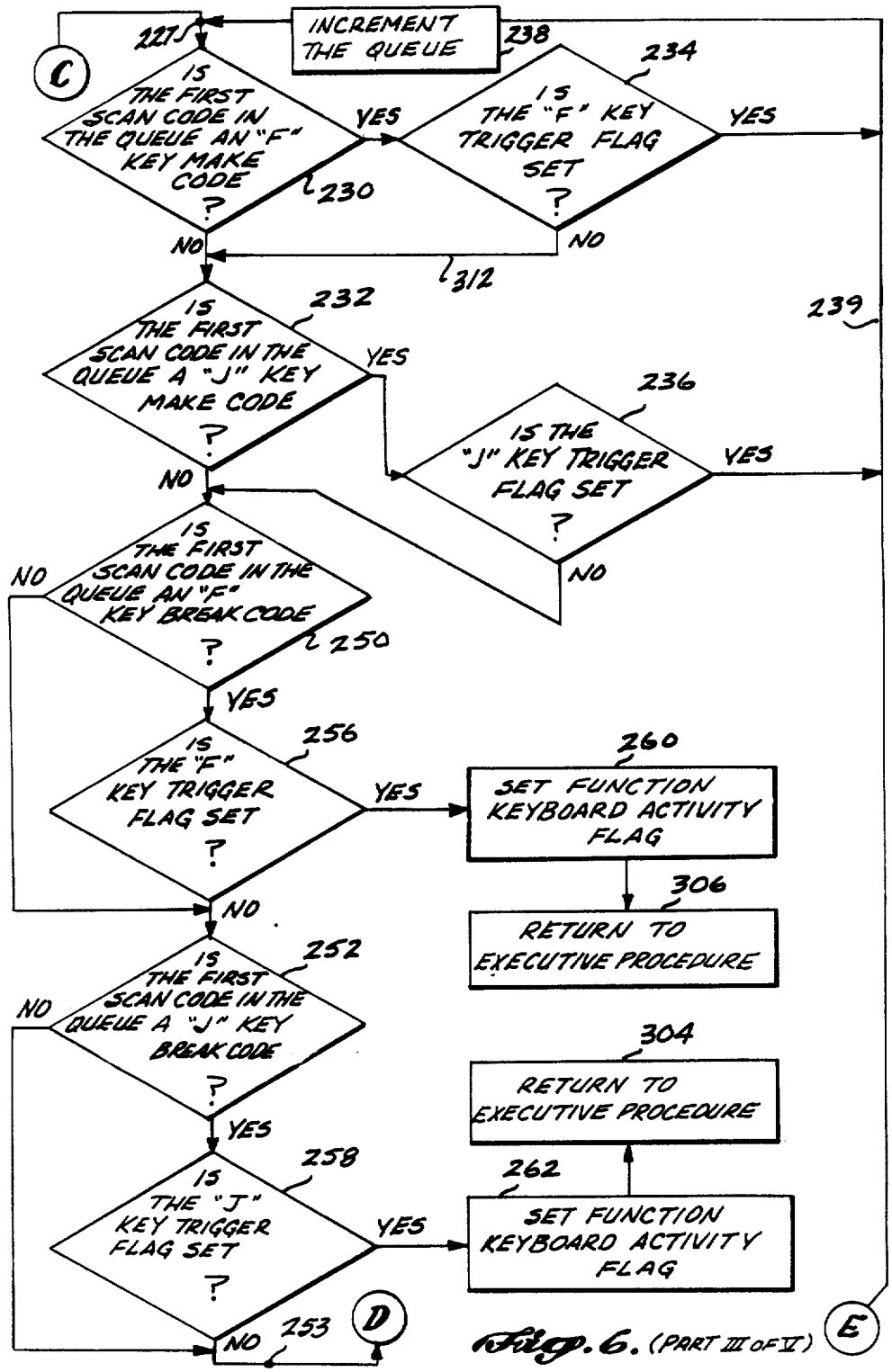

(PART IV OF V)

(PART V OF V)

SYSTEM FOR SELECTIVELY MODIFYING CODES GENERATED BY A TOUCH TYPE KEYBOARD UPON DETECTING OF PREDETERMINED SEQUENCE OF MAKE CODES AND BREAK CODES

FIELD OF THE INVENTION

The invention relates to apparatus and methods for enhancing the operation of computer keyboards. Specifically, the invention relates to an enhancement for computer keyboards of the type which generate "make codes" when a keyboard key is depressed, and corresponding "break codes" when a keyboard key is released. Make and break codes are often collectively referred to as 'scan codes.' The invention has particular utility in retrofitting personal computers having separate keyboards attached thereto by a cable, wherein the keyboard has function keys and other keys in addition to the standard touch-type keys on a universal keyboard.

DESCRIPTION OF THE RELATED ART

Conventional typewriter keyboards were originally designed with a QWERTY style keyboard incorporating the letters of the alphabet, A-Z and four punctuation symbols, including a comma, a period, a semicolon, and a slash mark. These keys were arranged in three rows, each row having ten keys. The letters were arranged on the keys so as to minimize the possibility of mechanical arms striking one another when frequently used keys were typed. At a later date, number keys representing the numbers 0-9 were added in a fourth row above the letter and punctuation keys. This keyboard eventually became known as the universal keyboard and, with a space bar beneath the lowest row of keys, comprised the typical keyboard for which typing manuals were devised to allow speed typing by touch.

Typists trained on the universal, touch-type keyboard can achieve extremely high speeds by utilizing memorized key strokes. Because the keys are spaced in a small group, the position of the hands need not be changed, and high typing speeds can be maintained.

The rapid growth of personal computers, supplemented by word processing programs, has largely replaced the conventional typewriter in the modern office. Typical keyboards for personal computers have nontouch-type keys in addition to the original forty keys of the universal, touch-type keyboard. For example, a personal computer manufactured by the International Business Machine Corporation, and sold under the IBM PC® trademark, has 83 keys separated in three distinct groups. The forty touch-type universal keys are positioned in a group in the center of the keyboard. To the immediate left of this group are Control, Shift and Alternate keys. To the immediate right of the central group, a Carriage Return key, a Shift key, and a Shift-Lock key are positioned. On the far right of this group, a second group of fourteen nontouch-type keys, including a numeric key pad, are found. To the far left of the central group, a two-column, five-row array of function keys, designated F1-F10, are located.

These additional keys are necessary for proper operation and full utilization of the various features of modern personal computers, especially when utilizing word processing programs. In particular, the Control key, which is just to the left of the universal touch-type keys, is heavily used in various programs. The Control key is a dedicated key which does not produce a character, space or any identifiable result on the computer display unless a second, different key is depressed after the Control key is depressed, and before the Control key is released. Operation of the Control key is particularly tiresome because of the frequency with which the Control key must be used, and because of the placement of the Control key off the touch-type universal key area. The Control key is typically depressed by the small finger on the left hand and must be maintained in the down position until the desired target key is depressed. For example, to execute the command "Control-t" the Control key is usually depressed with the small finger of the left hand, while the letter t key is depressed with the index finger of the right hand. Thus, one of the most frequently used keys on the keyboard (the Control key), and one which must be depressed before another key is depressed, is impossible to touch-type.

The remaining twenty-two keys, which are also non-touch-type keys, greatly reduce the speed with which personal computers can be operated because of the reaching and looking which a typist must do to access these keys. The position of these additional keys forces the typist to break his or her touch-type routine and slow to a greatly reduced typing speed.

Sophisticated personal computers, such as the IBM PC® brand personal computer, utilize a synchronous data transfer protocol between the keyboard and the computer. The keyboard is typically physically separate from the computer and is connected thereto by a multi-conductor cable. The IBM PC® keyboard is connected to the computer by a five-conductor cable. The five conductors comprise a reset line, a ground line, a clock line, a serial data transmission line, and a power line.

Depression of a key on the keyboard generates an eight-bit make code which is transmitted serially over the data line to the computer. Releasing the key generates a corresponding eight-bit break code which is sent over the data line after the make code. The clock line is held in a normal high state by pull up resistors and synchronizes the transmission of the make and break codes with the computer's on board clock. The keyboard sends a data bit and the computer reads the bit sent every time the clock line goes low. In this way, the data is transmitted synchronously with the computer clock.

The first seven digits of the make and break codes identifies the key which has been depressed. The eighth (most significant) bit of the eight-bit data word indicates whether the key is depressed (a make code) or released (a break code). For example, the letter A on the keyboard is key number 30 and, therefore, is represented digitally by seven digits as key 0011110. The eighth and most significant bit is 0 if the code is a make code, or 1 if the code is a break code. The computer holds the data line low while a data word is processed and only allows the data line to go high when it is ready to receive another eight-bit word.

The computer usually generates a character on the readout (such as a CRT screen) when a make code is received. The break codes only come into play when the "hold down" keys, such as the Control, Alternate or Shift keys are used. These keys do not generate a character or space when depressed, but only cause the computer to perform a function if they are immediately followed by another make code before the corresponding hold down key break code is received. Therefore, depression and release of the Control key alone does not cause any discernible operation of the computer to take place. However, if the Control key make code is immediately followed by a different make code, such as a "t" key make code, then the computer will perform the "Control-t" command.

The use of make and break codes in keyboards of this type has made it possible in the present invention to make the dedicated touch-type keys, such as the space bar and letter keys perform the functions of the nontouch-type keys by monitoring the sequence in which the keys are depressed and released.

SUMMARY OF THE INVENTION

Therefore, it is an object of the present invention to allow touch-typing of all the keys on a computer keyboard.

It is a further object of the invention to allow touch-typing of keys which conventionally must be held down while other keys are depressed.

It is yet another object of the present invention to achieve the above objects without substantially interfering with the normal operation of touch-type keys on the keyboard.

The invention achieves these objects, and other objects and advantages which will become apparent from the description which follows by detecting a specific series of keystrokes which indicate that a touch-type key is being used in a nonconventional way.

In its broadest terms, the invention comprises a method for detecting a triggering key-stroke sequence consisting of a touch-type trigger key depression followed by a target key depression and release prior to release of the touch-type trigger key. The triggering sequence can also consist of a touch-type trigger key depression followed by a target key depressing and automatic repeating of the target key prior to release of the trigger key. Automatic repeating of a key occurs in most computers if a key is held in the down position for a predetermined period.

Upon detection of the triggering sequence, some of the codes generated by the keys are translated into different key codes and sent to the computer. Thus, the computer responds as if a different series of keys were typed.

In one version of the invention, the trigger key is the touch-type space bar and upon detection of the triggering sequence, a Control key make code followed by the target key make and break codes, followed by a Control key break code is sent to the computer. The space bar make and break codes are translated by the device into the Control key make and break codes so that the computer responds as if the Control key had been depressed instead of a space bar. The codes are not sent until the third code in the triggering sequence, that is the target key break code or an auto-repeating target key make code, is detected so that typists who overlap keys while typing at high speeds do not inadvertently trigger the alternate mode of operation. Conversely, if the space bar is depressed and immediately released, an untranslated space bar make code followed by an untranslated space bar break code, is sent to the computer. A normal space appears on the CRT screen. In this way, the space bar maintains its conventional function. Only when target key codes appear between the space bar make and break codes (between depressing and releasing the space bar), are the space bar make and break codes translated into Control key make and break codes. A normal space will not appear on the CRT screen until the upstroke of the space bar. Normally, the space appears on the screen on the downstroke. This delay is unnoticeable by the computer operator.

In another version of the invention, the trigger key is a touch-type key, other than the space bar and the target key codes are translated into different codes and are sent to the computer. In this way, all of the additional nontouch-type keys (in addition to the Control key) can be associated with the standard touch-type keys and activated by typing the triggering sequence.

If the touch-type trigger key is pressed and released, a normal character appears on the CRT screen. In this way, the trigger key maintains its conventional function.

In a preferred embodiment the invention comprises a keyboard enhancing device which has a memory for sequentially storing keyboard key make and break codes generated by keyboard key strokes. The device detects the triggering sequence of the codes which serially include a touch-type trigger key make code, a target key make code and the corresponding break code of the target key make code in the memory or an auto-repeating target key make code. This indicates that a target key has been depressed and released (or auto-repeating of the target key commenced) while a touch-type trigger key is held down. Some of the codes in the memory are translated into different codes and sent to the computer if the triggering sequence is detected. The codes in the memory are sent untranslated to the computer if the triggering sequence is not detected so that the keyboard performs normally.

In the preferred embodiment there are at least two trigger keys. The first trigger key is the space bar, which is used to simulate the Control key. By holding down the space bar while another key is typed (depressed and released), a Control key make code followed by the second key's make and break codes followed by a Control key break code will be sent to the computer. The second trigger key is one of the touch-type keys other than the space bar. Depression of the second trigger key, followed by typing a target key, activates the additional assigned function of the target key. In this way, all of the nontouch-type key functions can be accessed by touch typing.

BRIEF DESCRIPTION OF THE DRAWINGS

FIG. 2 is a circuit diagram of the present invention.

FIG. 3A and 3B together is a schematic representation of the touch-type keys on the keyboard including designations for assigned functions of the nontouch-type keys utilizing the f and j keys as trigger keys.

DESCRIPTION OF THE PREFERRED EMBODIMENTS

Figure 1:
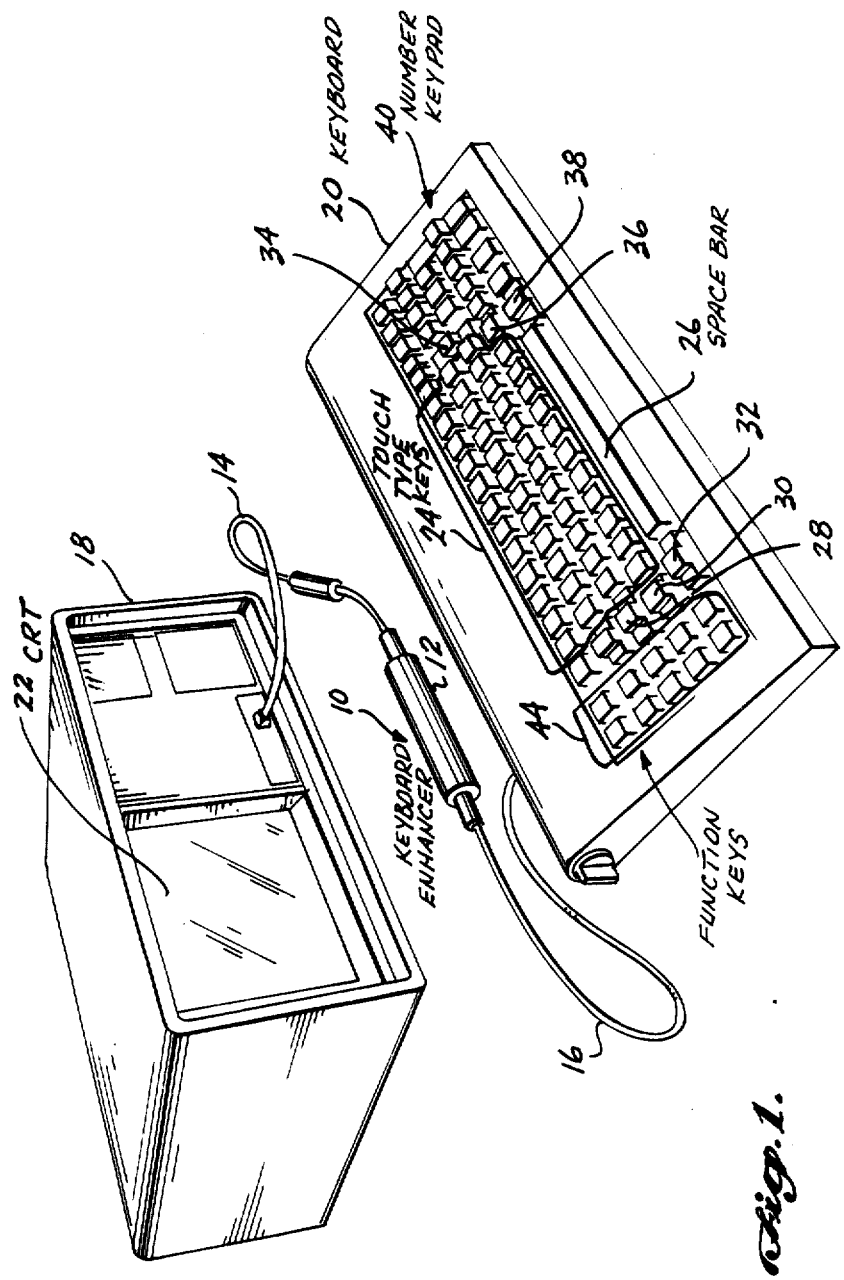
FIG. 1 is an isometric view of the present invention in use with a conventional computer having a display, and a keyboard having touch-type keys, including a space bar and nontouch-type keys.

In FIG. 1, a keyboard enhancing device, in accordance with the present invention, is generally indicated at reference numeral 10. The device is contained in a housing 12 having cables 14 and 16 connected thereto for connecting the device to a computer 18 and a computer keyboard 20. The computer shown is commonly known as a personal computer and typically includes a CRT display 22.

The keyboard 20 is of the type which contains touch-type keys generally indicated by area 24 and a touch-type space bar 26. The touch-type keys and space bar correspond to what is commonly known as the universal keyboard and includes the letters of the alphabet, including four punctuation symbols in the bottom three rows of the area 24 and numbers 0-9 on the top row of the area 24. The keyboard includes additional non-touch-type keys which are outside of the area 24. These keys include a Control key 28, a Shift key 30 and an Alternate key 32 to the left of the touch-type key area 24. To the right and adjacent to the touch-type area is a Carriage Return key 34, another Shift key 36 and a Shift-Lock key 38. To the far right of the touch-type area 24 is a number keypad 40 including keys for numbers 0-9 and other additional keys. These keys are non-touch-type keys. To the far left of the touch-type key area 24 is a two-column by five row function key array (F1-F10) 44, which controls various functions of the computer 18.

The keyboard 20 is of the type which generates a make code for every downstroke of a keyboard key and break code for every upstroke of a keyboard key. In addition, the keyboard has an auto-repeat feature which automatically generates additional make codes if a key is maintained in the depressed position for a predetermined period. The Control key 28, Shift key 30, and Alternate key 32 are special keys in that they perform no function unless another key is depressed after one of these special keys is depressed and before one of these special keys is released. For example, depression and release of Control key 28 is interpreted by the computer as a nonfunction and no character or space is generated on the display 22. However, if the Control key is depressed and immediately followed by depression of another key, (Example: a Control key make code followed by a letter t make code), the computer interprets this series as a request for the Control-t command sequence.

In general, the touch-type keys in the touch-type key area 24 and the space bar generate a character or space, respectively, on the display 22 when the key make code or space bar make code is sent. The break codes for these keys generally do not perform any function which is utilized by the computer. The function keys 44 and the keys on the numeric key pad 40 generally operate in the same fashion.

The keyboard enhancing device 10 allows the typist to touch-type the Control key 28 on the space bar 26 if a specific triggering sequence of make and break codes is generated by the typist. In this way, the space bar 26 performs a second function in addition to its dedicated function of typing ordinary spaces. For example, in order to activate the Control-t function in the computer 18, the typist need only depress the space bar 26, and prior to releasing the space bar, depress and release the touch-type t key in the touch-type key area 24. The keyboard enhancing device 10 immediately recognizes the sequence: space bar make code, t make code, t break code, as an indication that the operator desires a Control-t. The keyboard enhancing device 10 then sends a Control key make code, followed by a t make code and a t break code to the computer 18. The computer executes the Control-t command upon receipt of the t make code. Note, however, that the device 10 does not acknowledge that the operator is requesting a Control operation until the break code of the touch-type t key has been received by the device.

The device also recognizes the sequence: space bar make code, t make code and second t make code as an indication that the operator desires a repeating Control-t and sends a Control key make code followed by two t make codes to the computer. This allows the operator to utilize the automatic key repeating feature of the keyboard. Note, however, that the device does not acknowledge the request until the t key begins auto-repeating.

It has been found that high-speed typists often overlap the typed keys, depressing a new key before the previous key has been released. For example, a high-speed typist may produce the sequence of codes: space bar make, t make, space bar break, and t break when the typist desires a space followed by a t character to appear on the display 22. If the device 10 were to recognize the first two codes in the sequence as a request to recognize the space bar 26 as a Control key, then the computer would execute a Control-t function when a typist had actually desired only a space followed by a t character. Note that this is exactly the way which the nontouch-type press and hold keys, comprising the Control key 28, Shift key 30 and Alternate key 32 operate. That is, these press and hold keys are interpreted by the computer as actuating a special function whenever the make code for one of these keys is immediately followed by the make code of another key.

As demonstrated by the above example, this arrangement is unsuitable for utilizing the space bar 26 in a dual function role. Instead, it is highly preferred to only recognize the space bar 26 as a Control key if the operator depresses the space bar 26 to issue a space bar make code and then depresses and releases the target key or holds the target key until auto-repeating begins. It has been found that the conscious effort required to establish the triggering sequence of: trigger key make code, target key make code and target key break code prevents fast typists from inadvertently triggering a Control function when a space followed by a normal letter is desired. Although a conscious effort is required to activate the Space Bar Control Key feature as described, far less effort and time is required than when utilizing the nontouch-type Control key 28. The Space Bar Control Key feature of the present invention does not suffer from the inherent distance limitation which the nontouch-type keys, such as the Control key 28 are subject to because of their excessive distance from the home position of the hands over the keyboard when positioned for touch typing. Therefore, once an operator has learned the Space Bar Control Key feature of the present invention, greatly increased typing speeds can be achieved while using much less effort.

FIG. 3 illustrates a Function Keyboard feature of the present invention which allows the typist to touch-type all of the nontouch-type keys, including the Control Key 28, Shift key 30, the Alternate Key 32, the Carriage Return key 34, second Shift key 36, all of the keys on the number key pad 40 and the keys in the two column by five row function key array (F1–F10) 44. The letters and numbers (in parenthesis) shown in FIGS. 3A and 3B represent the letters and numbers of the universal touch type keys on a universal keyboard. The superscript symbols and terms above each key represent all of the functions of the nontouch-type keys of the keyboard 20. In this feature of the invention, two trigger keys, the j key 50 and the f key 52 are provided. When either of these keys are depressed the remaining keys in the touch-type area 24 are translated by the device 10 into the functions indicated by the superscripts above the keys.

Two trigger keys on opposite sides of the keyboard as indicated by the dotted line 54 are provided so that while the left hand is depressing the f trigger key 52, for example, the right hand is available to type the superscript functions on the right hand side of FIG. 3B. Similarly, while the right hand is activating the j trigger key 50 on the right hand side of the keyboard, the left hand is free to touch-type the functions indicated by the superscripts on the left hand side of the keyboard as indicated by FIG. 3A.

The device 10 recognizes a similar triggering sequence as described for the Space Bar Control Key feature which utilizes the space bar 26 as a Control key. Whenever either the j trigger key 50 or f trigger key 52, is depressed and a second target key (being any one of the other touch-type keys on the keyboard) is depressed and released before the trigger key is released, the device 10 translates the make and break codes of the target key into the associated make and break codes of the key indicated by the superscript above the target key. The device also operates in this manner if the target key is held down until auto-repeating begins before the trigger key is released. However, unlike the Space Bar Control key feature, the trigger keys are not translated or sent to the computer at all so that the computer only receives the translated target key codes as if the conventional nontouch-type key indicated by the superscript had been typed.

For example, if the typist desires to send a request for the F4 function key to the computer 20, the typist need only perform the following steps: depress the f or j trigger key 50 or 52 and before releasing the trigger key depress and release the touch-type (top row number 4 target key. The device 10 interprets the triggering sequence: f or j make code, touch-type target key make code and corresponding touch-type target key break code, as an instruction to send an F4 function key make code, F4 function key break code series to the computer. Upon receipt of the F4 make code the computer will immediately execute the F4 function key.

Note that the device 10 does not send the translated target codes to the computer 20 until the typist has released the target key or until auto-repeating of the target key begins. As previously described for the Space Bar Control key feature, inclusion of the target key break code in the triggering sequence (or an auto-repeat target key make code) is necessary to prevent inadvertent operation of the Function Keyboard feature when high-speed typists overlap typing on the touch-type keys. For example, touch typists commonly type the word "fox" so that the following sequence of codes is generated: f make code, o make code, f break code, x make code, o break code and x break code. If the device 10 were to send the translated target codes upon detecting the downstroke of the target key, (the o make code) instead of the upstroke (the o break code) or auto repeat thereof, the result of typing the above sequence would be "9x" on the display 22. By including the target key break code or auto-repeat target key make code in the triggering sequence thereby only sending the translated target key codes on the upstroke or auto-repeat of the target key, a conscious effort is required on the part of the typist to activate the Function Keyboard feature. It has been found that once a typist is trained in this feature, the speed and facility with which the non-touch type keys on the keyboard 20 can be accessed is significantly improved.

As is best shown in FIG. 3A, the functions performed by the Control key 28, Shift key 30 and Alternate key 32 have been assigned to touch-type key t, touch-type key q and touch-type key w respectively. As previously stated, the hold-down keys conventionally require that the operator hold the key down while typing the target key to generate the appropriate series of codes for the computer 18. For example, to execute the Alternate-F5 command sequence, the regular Alternate key 32 would be held down, and the regular F5 function key (in area 44) would be pressed and released, followed by the releasing of the regular Alternate key 32. In the present invention, the device 10 allows these functions, when accessed through the Function Keyboard feature to be activated by pressing and releasing the key prior to typing the desired target key. For example, to execute the Alternate-F5 command sequence with the present invention, the following key strokes can be used: depress the touch-type j trigger key 50, depress and release the touch-type w key and depress and release the touch-type (top row) 5 key. This results in the following codes being sent to the device 10: ]make code, w make code, w break code, 5 make code, and 5 break code. The device 10 interprets this sequence of codes as an indication that an Alternate-F5 command sequence is desired. The device translates the 5 make code and the 5 break code into an F5 function key make code and F5 function key break code, respectively. The device also generates an Alternate key make code and an Alternate key break code and sends the translated and generated codes to the computer 18 in the following order: Alternate key make code, F5 make code, F5 function key break code and Alternate key break code. The device 10 does not send the touch type j trigger key 50 make and break codes or the touch type w key make or break codes at all.

A keyboard 20 and computer 18 equipped with the keyboard enhancing device 10 allows a typist to touch type all of the keys which previously were unavailable for touch typing. Furthermore, with the keyboard enhancing device 10 installed the need for keys off the touch-type key area 24 is eliminated and keyboards 20 may be manufactured without such keys and therefore at a reduced cost.

The typist may desire to type more than one of the superscript functions at a time. To eliminate the need to hold down an f 52 or j 50 trigger key for long periods of time, the Function Keyboard may be "function-locked." This is done by first holding down the number 5 key on the numeral keypad (area 40), then typing the conventional Shift-Lock key 38. All Function Keyboard keys may now be typed without the need to first hold down an f 52 or j 50 trigger key. To release the "function-lock" and restore the keyboard to normal, the above sequence is simply repeated.

Both the Space Bar Control Key feature, and the Function Keyboard feature may be turned on or off, at the typist's discretion. To turn the Space Bar Control Key feature on, the number 5 on the numeral keypad (area 40) is held down, and the F1 function key (area 44) is typed. To turn the Space Bar Control Key feature off, the number 5 on the numeral keypad (area 40) is held down, and the F2 function key (area 44) is typed. To turn the Function Keyboard feature on, the number 5 on the numeral keypad (area 40) is held down, and the F3 function key (area 44) is typed. To turn the Function Keyboard feature off, the number 5 on the numeral keypad (area 40) is held down and the F4 function key (area 44) is typed. In all of the above cases of turning keyboard enhancement features on or off, none of the scan codes of the keys involved reach the computer. They are used solely to signal to the keyboard enhancing device 10, to turn the various enhancement features on or off.

FIG. 2 illustrates the preferred circuitry for the present invention which is contained in the housing 12 and operatively connected to the computer 18 and keyboard 20 through cables 14 and 16, respectively. The circuit has a microcomputer 60 which has an on-board random access memory (RAM), an on-board read only memory (ROM) and an internal central processing unit. The preferred microcomputer is an Intel Corporation 8751H-88 16 bit microcomputer. The microcomputer also has serial data transmission lines 62 and 62A, synchronous clock lines 64 and 64A, a ground line 66, and a reset line 68. Each of these lines has a connector pin indicated by a square at the end thereof. In addition to the above lines, the microcomputer 60 is connected to a power line 70 having connector pins at the end thereof, indicated by squares through a direction sensing operational amplifier 72. The operational amplifier has two resistors 74 and 76 between the inverting and noninverting inputs thereof. The resistors are in series on the power line 70.

Because the operational amplifier 72 is not provided with negative feedback it operates in the open loop mode. The output 78 of the operational amplifier indicates the direction of polarity on the power line 70 by going into either negative or positive saturation. The microcomputer 60 interprets the polarity of the voltage at the output 78 of the direction sensing operational amplifier 72 and an indication as to the direction in which the device 10 is connected between the computer 18 and the keyboard 20. Because the computer supplies power to the keyboard through line 70, monitoring of this line as disclosed indicates the direction in which the device is connected.

The microcomputer 60 assigns the correct ports on the data line 62 and clock line 64 according to this information. A conventional power on reset circuit is generally indicated by reference numeral 80. A piezoelectric horn 82 and associated conventional driving circuitry, generally indicated at reference numeral 84 is connected to the microcomputer 60 and controlled thereby to indicate a request for a Shift key, Alternate key or Control key request. It has been found that the present invention does not always activate the tone generating devices in computers other than the IBM computer 18 as is desired when a hold-down key, such as the Control key, is requested via the Function Keyboard. therefore, device 10 includes the horn 82 to alleviate this problem.

The device 10 is provided with an external memory device 90 in the form of an electrically erasable, programmable read-only memory (EEPROM) which stores the current feature selections of the device 10, which is recalled after the computer 18 has been turned off. If the number 5 on the numeral keypad (area 40) is held down, and the regular Control key 28 is pressed and released, the present state of the device 10 (space bar Control Key on/off, Function Keyboard on/off) will be remembered by the EERPOM 90 when the computer is turned on again at a later time, thus eliminating the need for the typist to turn either or both of these features on manually.

The logical sequence for determining when touch-type keys are being used for normal typing or as part of the Space Bar Control Key feature or Function Keyboard feature is shown in detail in FIGS. 4-7 in logic flow diagrams. The logical decision steps and activity steps disclosed by these diagrams is executed as a computer program in the microcomputer 60. This is the preferred method for executing the logic of the present invention. However, the program architecture has been designed to closely model discrete components so that one skilled in the art can readily execute the logic diagrams as discrete circuit elements.

Figure 4:
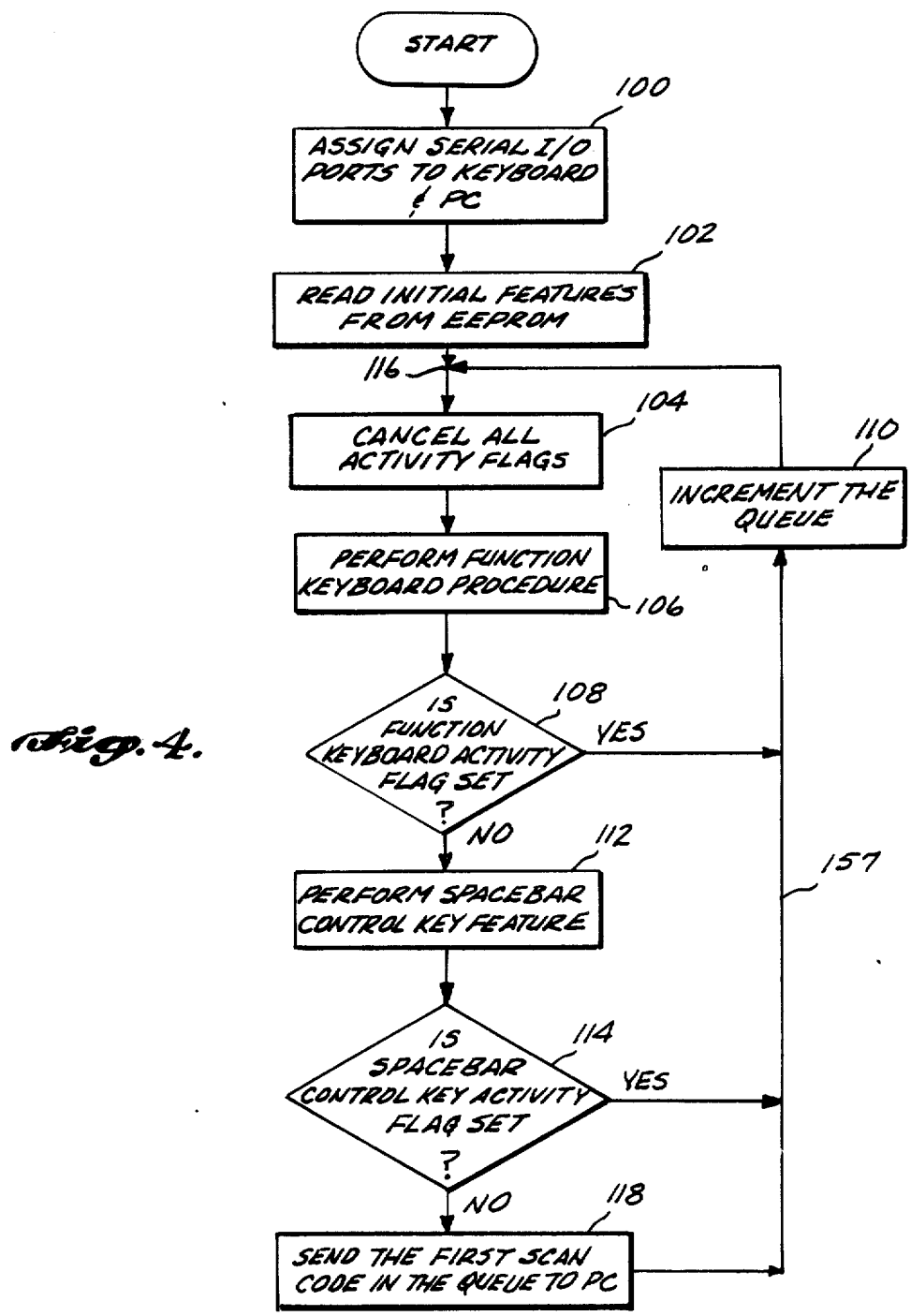
FIG. 4 is a logic diagram for an Executive Procedure for a computer program embodying the present invention.
Figure 5:
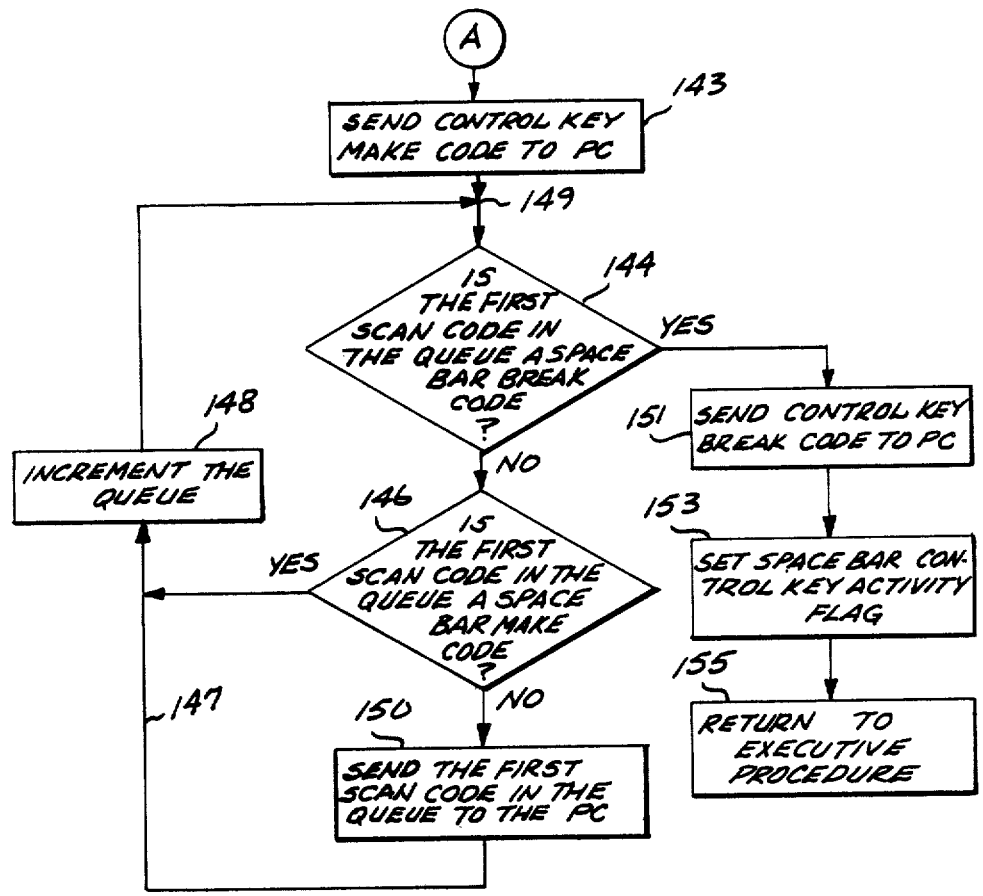
FIG. 5 comprises a logic flow diagram for a Space Bar Control Key feature subroutine of the present invention which is called on by the Executive Procedure and allows the touch-type space bar of the keyboard to be utilized as a Control key in addition to its normal function as a space bar.
Figure 6:
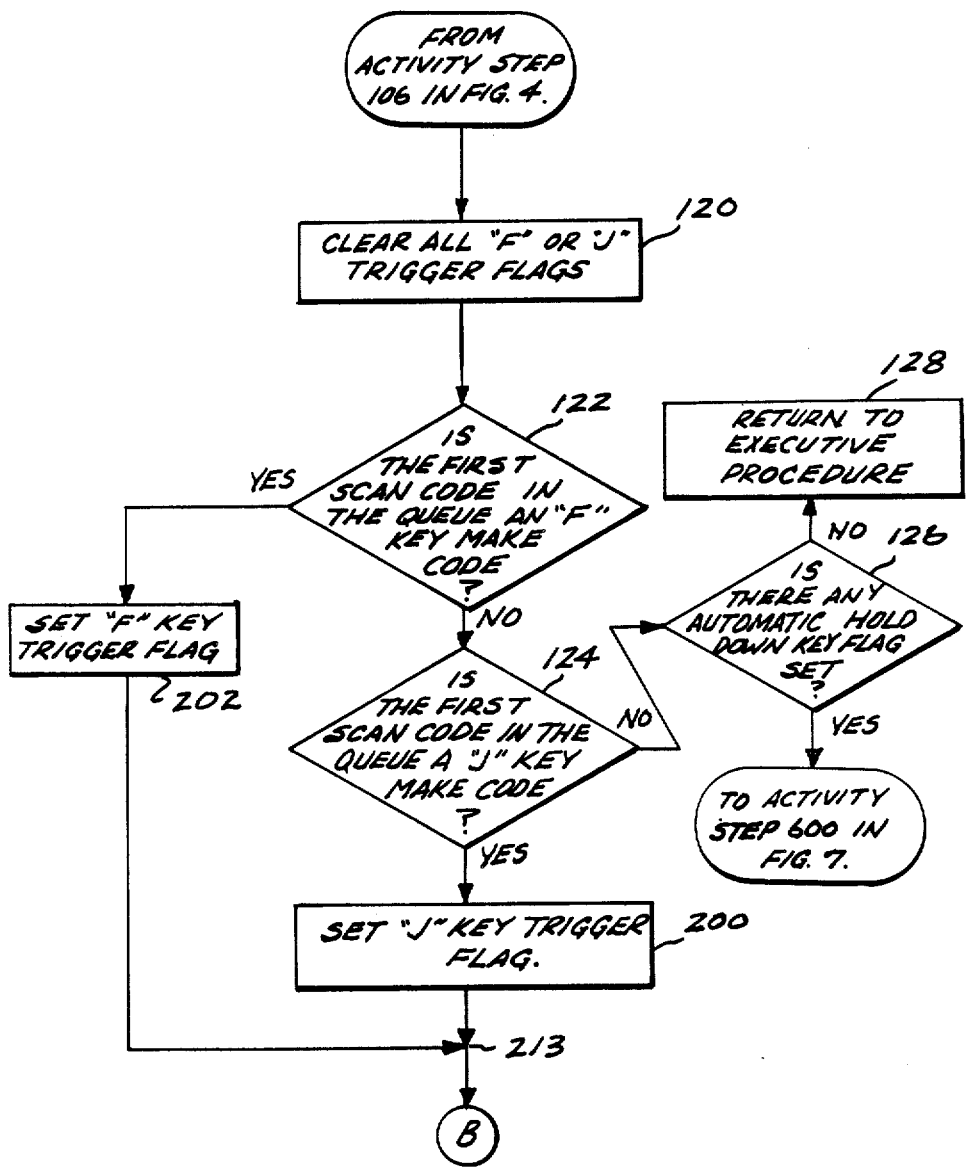
FIGS. 6 and 7 comprise a logic flow diagram for a Function Keyboard feature subroutine of the present invention which is called by the Executive Procedure and which allows all of the nontouch-type keys on the keyboard to be operated by depression of the f or j key while another of the touch-type keys is depressed and released; the functions being indicated in FIG. 3.
Figure 6:
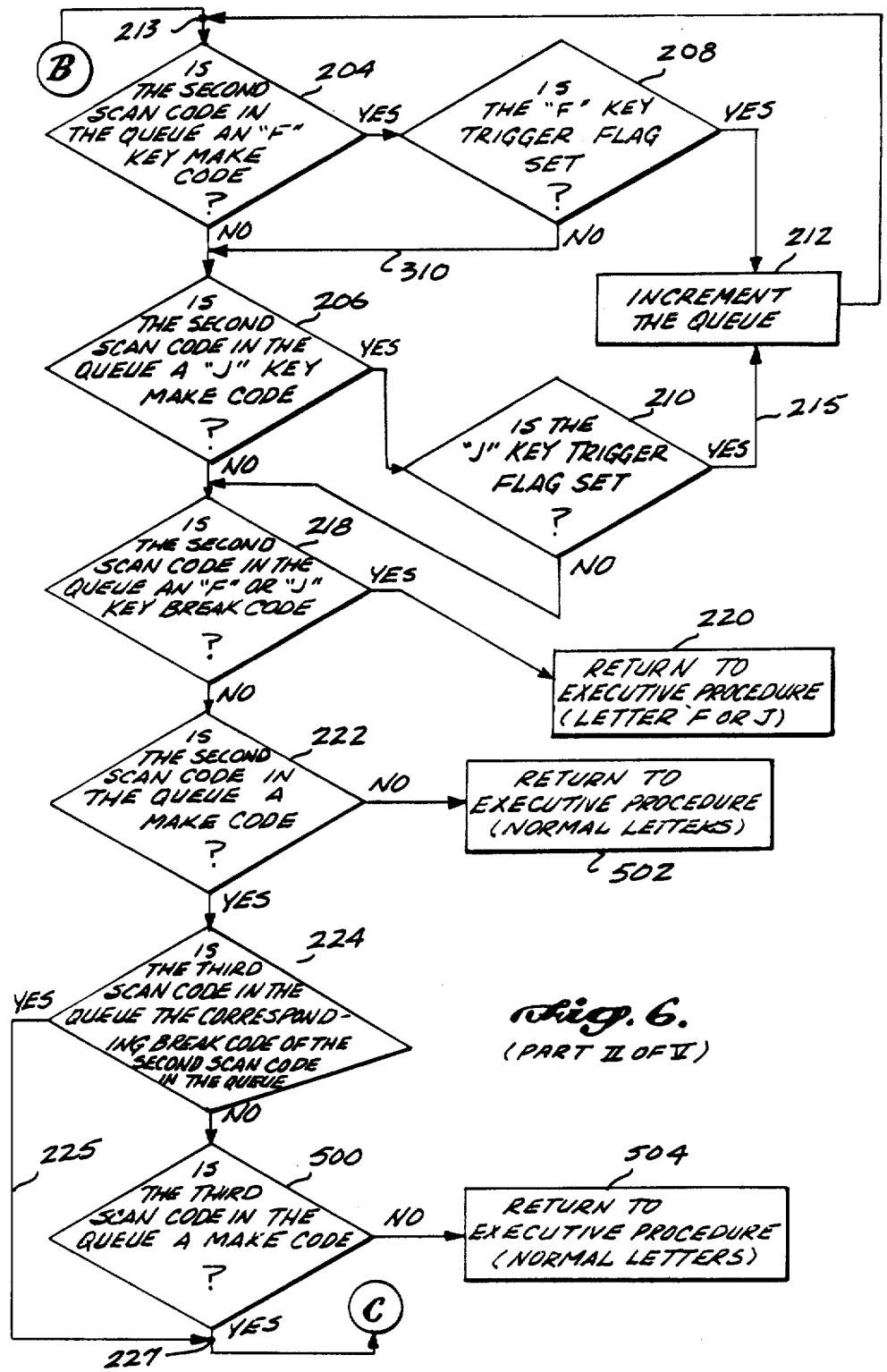
Figure 6:
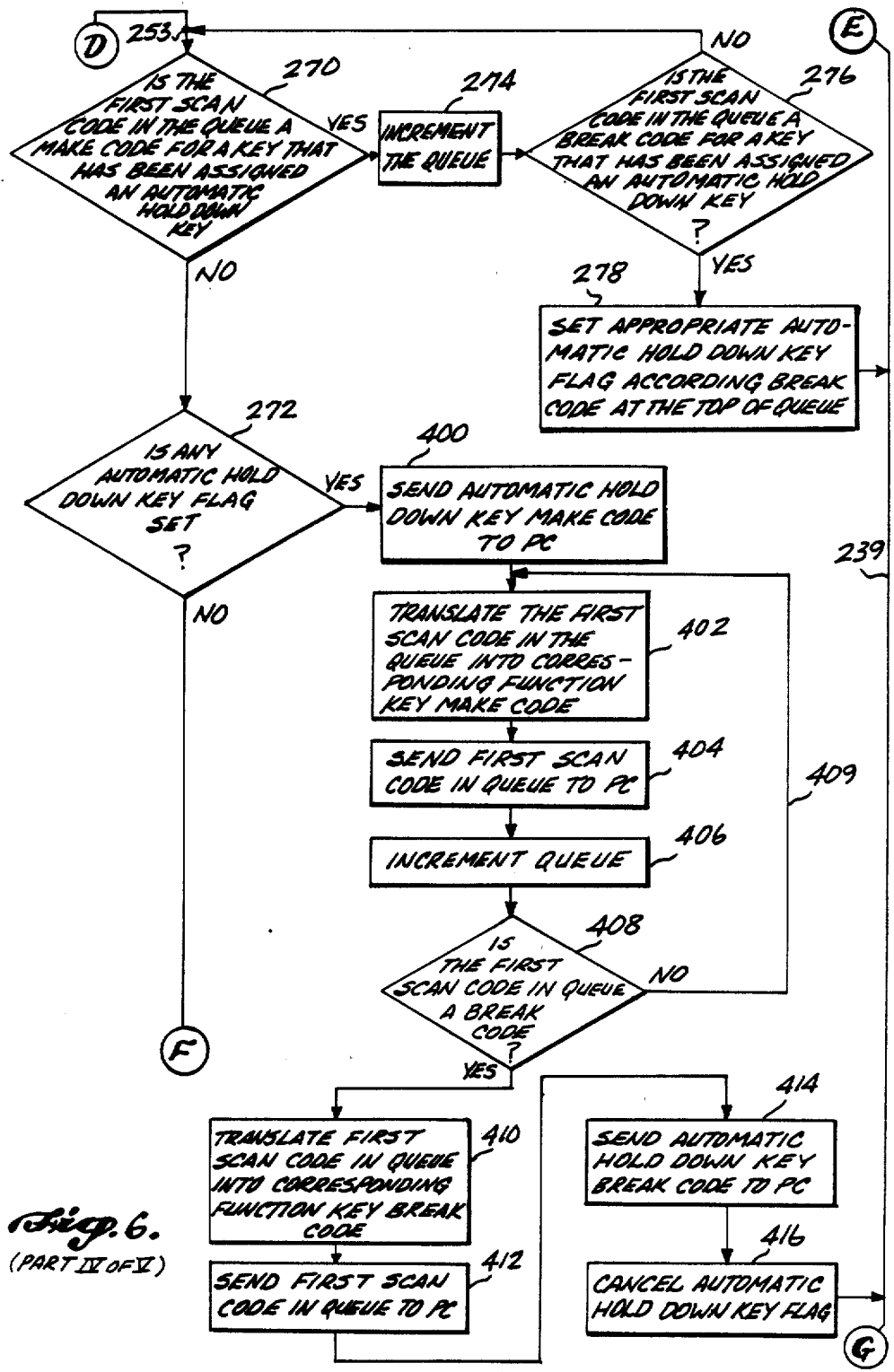
Figure 6:
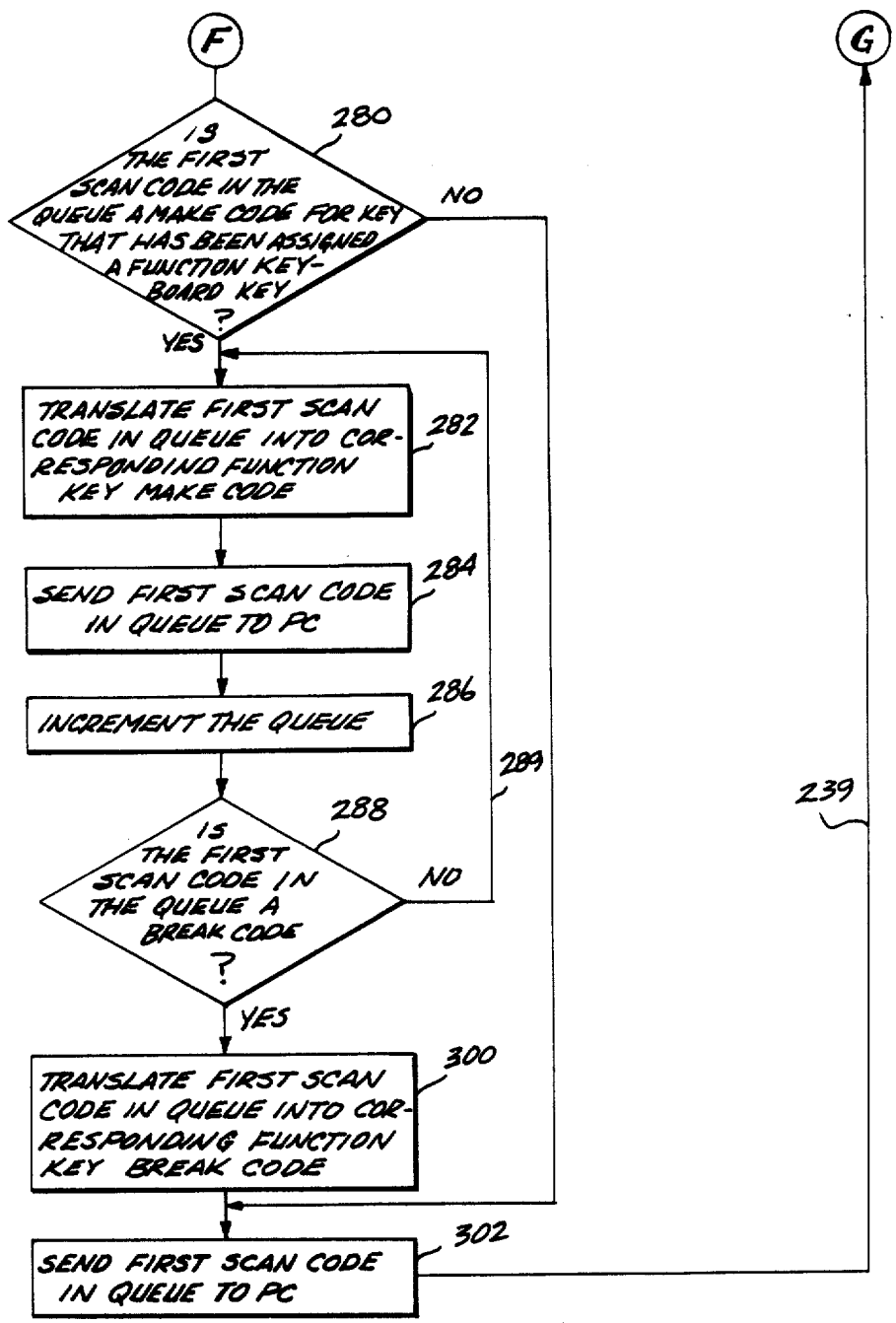
Figure 7:
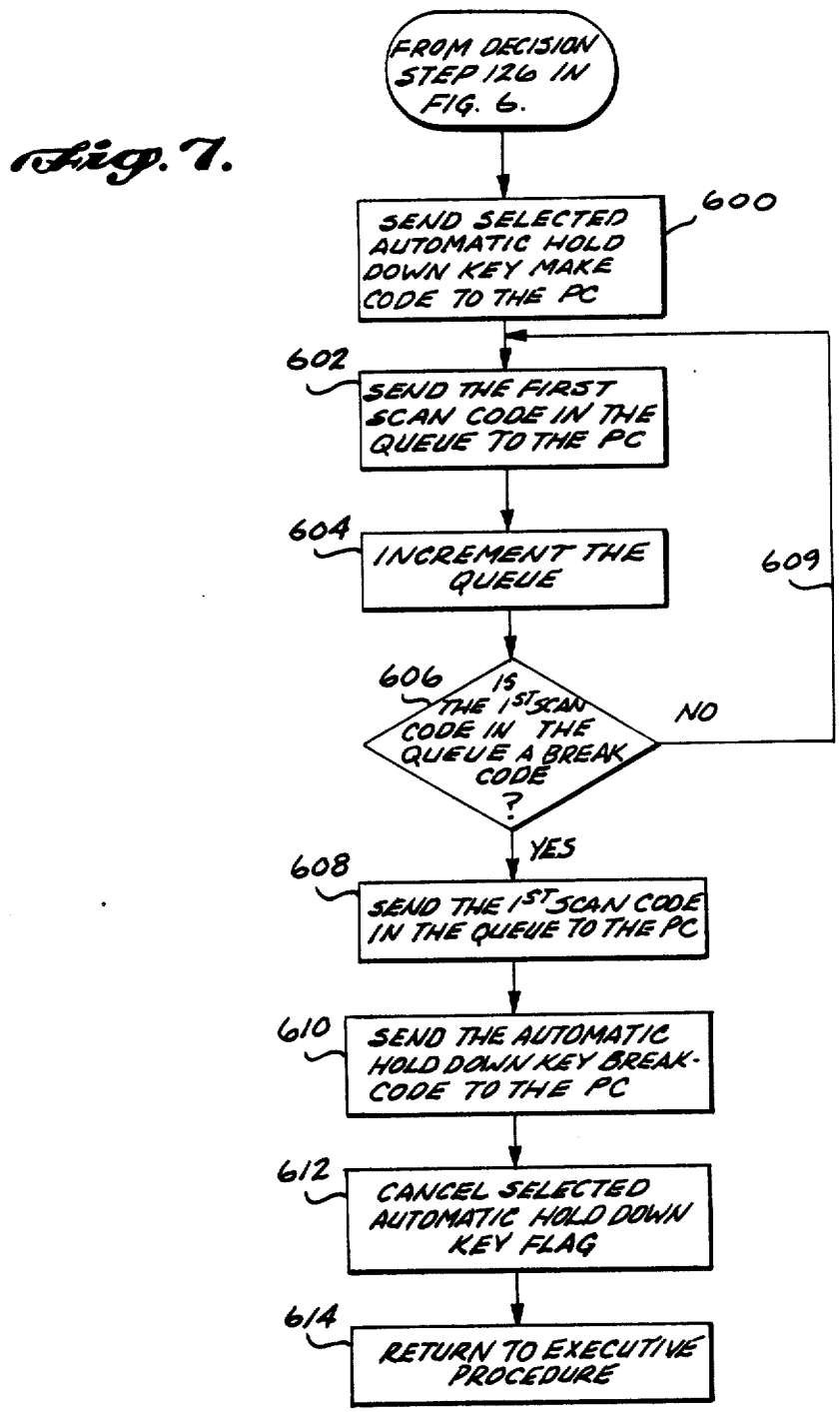

FIG. 4 illustrates the logic steps for integrating the activity of the Space Bar Control Key feature, which is the subject of FIG. 5, and the Function Keyboard feature, which is the subject of FIGS. 6 and 7. The decision and activity steps embodied in logic diagrams 4-7 are stored as program steps in the on-board ROM of the microcomputer 60. Make and break codes generated by typing on the keyboard 20 are received by the microcomputer 60 over the data line 62 or 62A (depending on which way the device 10 is connected) and are stored in the on-board RAM of the microcomputer 60. The microcomputer has been programmed to store the data in the form of a first in, first out memory register so that the first code received by the memory is the first code available from the memory. This arrangement facilitates conversion of the logic diagrams into a logical arrangement of discrete components if desired.

As shown in FIG. 4, once the memory or "queue" has been loaded with codes from the keyboard, the multiprocessor within the microcomputer 60 begins processing the codes. As indicated by the Executive Procedure of FIG. 4, the microcomputer first assigns the serial inboard-outboard ports to the keyboard 20 and computer 18 according to the output 78 of the direction sensor 72 as indicated by activity in step 100. In activity step 102, the initial features which have been previously selected by the typist before the computer was turned off, are read from the EEPROM 90. The Executive Procedure then cancels any activity flags which may have been set by procedures in the Space Bar Control Key feature or Function Keyboard feature as will be described later and as instructed by activity step 104. The Executive Procedure then calls the Function Keyboard logic subroutine shown in FIGS. 6 and 7 at activity step 106. If a triggering sequence of: f or j make code, target make code and target break code has been detected by the Function Keyboard feature subroutine, a Function Keyboard activity flag is set and in decision step 108 the Executive Procedure will instruct the multiprocessor unit to increment the queue in the on-board RAM according to activity step 110.

If the triggering sequence for the Function Keyboard feature has not been detected, then the Space Bar Control Key feature subroutine, embodied in FIG. 5 will be called by the Executive Procedure according to activity step 112. If the Space Bar Control Key triggering sequence: space bar make code, target key make code and target key break code is detected by the Space Bar Control Key subroutine, then a Space Bar Control Key activity flag will be set and according to decision step 114 the queue will be incremented and the logic flow will reenter the Executive Procedure at node 116. If, however, the Space Bar Control Key triggering sequence is not detected, then the first code in the queue will be sent to the computer according to activity step 118 in the Executive Procedure. The queue will be incremented and the logic flow will return to node 116. Thus, it is apparent that when a typist is typing normal letters, spaces and functions, whether touch-type or nontouch-type, if the triggering sequences are not present then the codes received by the microcomputer 60 serial data transmission lines will be sent to the computer 18 untranslated. If, however, the triggering sequence for either the Space Bar Control key feature or Function Keyboard feature is detected, then some of the codes in the queue will be sent to the computer in a translated state as previously described. The translated codes can be stored in a conventional look-up table in the microcomputer on-board ROM.

For the purpose of clarity, and to enable those skilled in the art to make and use the invention, this description will continue with a series of examples which illustrate the logic flow of the Executive Procedure, Space Bar Control Key subroutine, and Function Keyboard subroutine. In each example, the serial contents of the queue will be shown in a vertical column on the left with a comment as to the activity executed shown in a corresponding column on the right. Because the queue represents a first in, first out memory, when the queue is incremented the first code in the queue (top of the queue) is lost, and the second code in the queue moves into the position of the first code. An increment in the queue is indicated by a horizontal line across the page with the new contents of the queue directly below the previous contents. The examples are provided in table form.

SPACE BAR CONTROL KEY FEATURE EXAMPLES

Example 1

Assume that the typist wishes to send a Control-t command sequence to the computer 18. The typist will depress the space bar and, while holding down the space bar, press and release the touch-type t key and thereafter will release the space bar. The contents of the queue and the actions performed by the microcomputer 60 are shown below in Table 1.

TABLE 1

| Queue Contents | Activities |
|---|---|
| space bar make code | Control key make code sent |
| t make code | to PC (personal computer) |
| t break code | |
| space bar break code | |
| t make code | t make code sent to PC |
| t break code | |
| space bar break code | |
| t break code | t break code sent to PC |
| space br break code | |
| space bar break code | Control key break code sent |

TABLE 1-continued

| Queue Contents | Activities |
|---|---|
| | to PC |
| | Space Bar Control key |
| | activity flag set |
| | return to Executive |
| | Procedure |
| empty | all activity flags canceled |

Once the input-output ports have been assigned by the executive Procedure as activity step 100, initial features are read from the EEPROM in activity step 102, and any pending activity flags are canceled by activity step 104. The Function Keyboard procedure is then entered.

In the Function Keyboard subroutine beginning in FIG. 6, any pending f trigger key or j trigger key flags are canceled in activity step 120. Decision step 122 asks if the first code in a queue is an f key make code. Examination of the above table indicates that the first code is a space bar make code and therefore decision step 124 is entered. Because the first code is not a j trigger key make code, decision step 126 is entered. Decision steps 122 and 124 essentially inquire whether the first code in the queue is an f or j trigger key make code. If this is the case, flags are set indicating that an f or j trigger key has been depressed. If this test is failed, decision box 126 is entered which determines if any automatic hold down key flag has been set. This test relates to the automatic hold down touch-type keys t, w and q which have corresponding Control key, Alternate key, and Shift key functions assigned to them. Because an automatic hold-down key flag has not been set, the logic flow returns to the Executive Procedure as indicated by activity step 128.

Upon returning to the executive procedure and entering decision step 108, it is noted that the Function Keyboard activity flag has not been set. Therefore, the Executive Procedure calls on the Space Bar Control key subroutine as shown in FIG. 5. The first decision step 130 is passed because the first code in the queue is a space bar make code. If the code was something else then this would be an indication that normal typing is being requested and the logic flow would return to the Executive Procedure through activity step 132.

The program next looks at the second scan code in decision step 134 where it is determined that the second code in the queue is not a space bar make code and the logic flow enters decision step 136. Had the second code in the queue been a space bar make code the queue would have been incremented according to activity step 138 and the logic flow would reenter decision step 134. The purpose of the loop indicated by line 139 is to eliminate superfluous space bar make codes once it has been determined by decision step 130 that the first code is a space bar make code. Additional space bar make codes can be generated by depressing and holding the space bar down for a predetermined period, whereupon the space bar will generate auto repeating space bar make codes. It has been found to be desirable to eliminate these extra codes in order to simplify the logic required to determine whether a triggering sequence exists. The user can therefore only generate multiple spaces on the computer display 22 by pressing and releasing the space bar. It is believed that the loss of the auto-repeating space bar is not significant.

Because the second scan code in the queue is not a space bar break code decision step 136 is failed and decision step 140 is entered. Because the second scan code in the queue is a make code (the t make code) decision step 142 is entered. Decision step 142 examines the third scan code in the queue and checks to see if this code is the corresponding break code of the second scan code in the queue. Because the third scan code in the queue (the t break code) is the corresponding scan code of the second code in the queue (the t make code) this test is passed and activity step 143 is entered which instructs the microcomputer to send a Control key make code to the computer as indicated by the notation in the activity column in Table 1. At this point, the Space Bar Control Key subroutine has detected the presence of the triggering sequence: space bar make code, target key make code, and corresponding target key break code which indicates that the typist is requesting a Control code.

The next sep, decision step 144, looks at the first code in the queue to determine if it is a space bar break code. Because the first code is a space bar make code, this test is failed and decision step 146 is entered. Because the first code in the queue is a space bar make code, loop 147 is entered and the queue is incremented according to activity step 148. In Table 1 this activity is indicated by the first horizontal line and the new contents of the queue are shown below the line. Note that the first code in the queue, space bar make code, has been lost because the queue has been incremented. Loop 147 reenters decision step 144 at node 149. Because the first code in the queue is not a space bar break code, step 146 is reentered.

However, during this iteration of loop 147, decision step 146 is failed because the first code in the queue is not a space bar make code, it is a t make code. Therefore, activity step 150 is executed and the first code in the queue (the t make code) is sent to the personal computer. This activity is indicated in the right hand column of Table 1. The loop 147 is reentered and the queue is incremented again.

During this iteration of loop 147 decision step 144 and 146 will be failed and the t break code will be sent to the PC at activity step 150. After the queue is incremented only the space bar break code will remain and decision step 144 will be passed. Therefore, activity steps 151, 153 and 155 will be executed and the Control key break code will be sent to the PC. A Space Bar Control Key activity flag will be set and the subroutine will return to the Executive Procedure as indicated in Table 1.

Upon returning to the Executive Procedure, note that the decision step 114 will be passed because the Space Bar Control Key activity flag has been set. The logic flow then enters loop 157 and the queue is again incremented by activity step 110, leaving the queue empty and the logic reentering the Executive Procedure at node 116. On the next iteration of the Executive Procedure, all the activity flags will be canceled.

The following examples show two situations in which overlapping letters and spaces are typed. These sequences fail to trigger the Space Bar Control Key feature as is required by the present invention.

EXAMPLE 2
TABLE 2

Example 2
Overlapping Letter and Space

| Contents of the Queue | Activities |
|---|---|
| r make code | return to Executive Procedure |
| space bar make code | return to Executive Procedure |
| r break code | r make code sent to PC |
| space bar break code | |
| space bar make code | return to Executive Procedure |
| r break code | return to Executive Procedure |
| space bar break code | space bar make code sent to PC |
| r break code | return to Executive Procedure |
| space bar break code | r break code sent to PC |
| space bar break code | return to Executive Procedure |
| | space bar break code sent to PC |
| empty | |

Table 2 illustrates the contents of the queue and the activity taken on the codes in the queue as the queue is incremented by the Space Bar Control Key feature subroutine. The logic flow in this example is similar to the example of Table 1 except the first decision step 130 in the Space Bar Control Key subroutine of FIG. 5 is failed and the logic flow returns to the Executive Procedure according to decision step 132. The first code in the queue (the r make code) is sent to the PC by activity step 118 in the Executive Procedure. The queue is incremented by activity step 110 and the Executive Procedure reentered at node 116. In each iteration of the Executive Procedure note that the logic flow returns to the Executive Procedure twice because decision steps 122, 124 and 126 are failed in the Function Keyboard subroutine. After the r make code has been sent to the PC and the queue incremented, the space bar make code is at the top of the queue. Note that decision step 140 of the Space Bar Control Key subroutine is failed because the second code in the queue is a break code. Thus the logic flow returns to the Executive Procedure by way of activity step 160 whereupon the space bar make code is sent to the PC by decision step 118 in the Executive Procedure.

After the queue is incremented by activity step 110, the r break code is at the top of the queue and decision step 130 in the Space Bar Control Key subroutine is failed causing the logic flow to return to the Executive Procedure and the r break code being sent to the PC by activity step 118 in the Executive Procedure.

After incrementing the queue in activity step 110, the space bar break code is at the top of the queue. Decision step 130 in the Space Bar Control Key feature is failed which causes the logic flow to reenter the Executive Procedure at activity step 132. The space bar break code is sent to the PC by activity step 118 in the Executive Procedure and the queue is incremented to leave the queue empty. Note that the Space Bar Control Key activity flag was never set because the triggering sequence was never detected by the Space Bar Control Key subroutine.

A third example of the Space Bar Control Key feature is an overlapping space and letter in which a high-speed typist overlaps a space followed by the letter r. Table 3 indicates both the contents of the queue and the activity taken in this situation.

EXAMPLE 3

TABLE 3

| Contents of the Queue | Activity |
|---|---|
| space bar make code | return to Executive Procedure |
| r make code | space bar make code sent to PC |
| space bar break code | |
| r break code | |

In the example illustrated in Table 3, the sequence of codes in the queue will pass test 130 in the Space Bar Control Key subroutine, fail decision step 134, fail decision step 136, pass decision step 140, but fail decision step 142. Because the third scan code in the queue (the space bar break code) is not the corresponding break code of the second scan code in the queue (the R make code) decision step 164 is entered where it is determined that the third scan code in the queue is not a make code. Therefore, activity step 166 is executed and the logic flow returns to the Executive Procedure as indicated in the activity column of Table 3.

The space bar make code is sent to the PC by activity step 118 in the Executive Procedure. The remainder of Table 3 has been deleted as the sequence of activities is apparent from the examples previously described. To summarize briefly, the r make code is now at the top of the queue, test 130 will be failed, and the r make code sent to the PC by the Executive Procedure. After incrementing the queue the space bar break code will be at the top of the queue and decision step 130 will again be failed causing the space bar break code to be sent to the PC by activity step 118 in the Executive Procedure. After incrementing the queue by activity step 110, the r break code will also fail decision step 130 in the Space Bar Control Key subroutine, the logic flow will return to the Executive Procedure and the r break code will be sent to the PC by activity step 118. The queue will be incremented and become empty.

In addition to the examples shown in Tables 1, 2 and 3, it will be readily apparent to one skilled in the art that the logic disclosed in the diagrams 4, 5, and 6 will adequately process normal typing, multiple Control code use and repeating Control code use by initiating the auto repeating feature of the touch-type target keys.

For example, if the target key is held down until auto-repeating begins, decision step 142 will be failed but decision step 164 recognizes that the triggering sequence: space bar make code, target key make code, second target key make code is present, the logic flow then enters activity step 142 to send the Control key make code to the computer.

FUNCTION KEYBOARD FEATURE EXAMPLES

The following examples illustrate the logic flow in the diagrams of FIGS. 6 and 7 and the interaction thereof with the Executive Procedure of FIG. 4. The Function Keyboard subroutine examines the scan codes in the queue which have been generated by keystrokes on the keyboard and determines if the triggering sequence exists.

The triggering sequence for the Function Keyboard feature is as follows: f or j trigger key make code, target key make code, and corresponding target key break code. Once this triggering sequence has been detected, the Function Keyboard subroutine translates some of the codes and sends the translated codes to the PC. The original, f or j trigger key make and break codes are eliminated from the queue and are not translated by the subroutine or sent to the computer. The Function Keyboard subroutine also allows the typist to type automatic hold down keys, including a touch-type Shift key, a touch-type Alternate key, and a touch-type Control key (in addition to the Space Bar Control Key feature). When these automatic hold down keys are typed utilizing the Function Keyboard feature, these keys do not have to be held down while the target key is typed as is necessary with conventional nontouch-type hold down keys.

EXAMPLE 1

The first example, which is illustrated in Table 4, shows the logical operations which are performed on the contents of the memory queue when the typist depresses and holds the f trigger key 52, types (depresses and releases) the touch-type (top row) number 6 key to send F6 function key make and break codes to the computer, and then releases the f trigger key.

TABLE 4

| Queue Contents | Activity |
|---|---|
| f make code | f key trigger flag set |
| 6 make code | |
| 6 break code | |
| f break code | |
| 6 make code | F6 function key make code sent |
| 6 break code | to PC |
| f break code | |
| 6 break code | F6 function key break code sent |
| f break code | to PC |
| f break code | Function Keyboard activity flag set |
| empty | all activity flags canceled |

Beginning in the Executive Procedure in FIG. 4 and after the activities of steps 100, 102 and 104 have been performed, the Function Keyboard subroutine is called by the executive Procedure at activity step 106. In activity step 120 of FIG. 6 any pending f or j trigger flags are cleared. Because none are presently pending no activity is taken. Decision step 122 is passed because the first code int eh queue is a f key make code, whereupon activity step 202 sets the f key trigger flag as indicated in the activity column in Table 4.

As previously stated, affirmative responses to decision steps 122 or 124 cause an appropriate trigger flag to be set for the f or j key. This allows either the f key or the j key to act as a target key for the other. For example, with reference to FIG. 3A, it is apparent that a typist who first depresses the j trigger key 50 with the right hand and then types the f key with the left hand desires a Right Cursor Arrow Key make and break code to be sent to the computer. As will be apparent from the description below, by setting the j trigger flag at activity step 200 and because the f trigger flag has not been set by activity step 202, the touch-type f key can be used as a target key for the j trigger key 50. Returning now to FIG. 6, decision step 204 and 206 are failed because the second scan code in the queue is neither an f key make code nor a j key make code (it is a number 6 make code). Decision steps 204 and 206 and corresponding decision steps 208 and 210 test for multiple trigger key make codes which are due to auto repeating of the trigger key. Such codes must be eliminated from the queue in order for the following logic to operate properly. Therefore, if multiple trigger key make codes immediately follow the first trigger key make code, activity step 212 increments the queue and returns the logic flow to node 213 through loop 215 to eliminate these codes.

Decision step 218 is failed because the second scan code in the queue is a 6 make code and not an f or j key break code. This test is utilized to determine if a normal letter f or j is being requested. If this is so, activity step 220 returns the logic flow to the Executive Procedure where the scan codes will be sent to the computer by activity step 118 of the Executive Procedure. Decision step 222 tests for the presence of a make code as the second code in the triggering sequence. Because the second code is a make code (it is a number 6 make code), decision step 224 is entered and it is determined that the third scan code in the queue is the corresponding break code of the second scan code in the queue. Loop 225 is entered which causes the logic flow to enter node 227. At this point, the Function Keyboard subroutine has determined that a triggering sequence of: trigger key make code, target key make code, and corresponding target key break code, exists in the queue and therefore a Function Keyboard feature is being requested. Decision steps 230 and 232 and corresponding decision steps 234 and 236 respectively, detect the presence of either the f or j make code at the top of the queue and cause that make code to be eliminated as long as the f or j key trigger flag, respectively, has been set. This is accomplished by incrementing the queue at activity step 238 through loop 239.

After incrementing the queue, the contents of the queue appears as is shown after the first queue increment in Table 4 with the 6 make code at the top of the queue. At decision step 250, the first scan code in the queue is examined and determined not to be an f key break code. Therefore, decision step 252 is entered, where it is determined that the first code in the queue is not a j key break code. This determination leads the logic flow to node 253, FIG. 12. Affirmative answers to the tests in decision steps 250 and 252 would indicate that the trigger key has been released. If the appropriate trigger flag has also been set, as determined in decision steps 256 and 258, then it is apparent that the Function Keyboard feature has been active and the Function Keyboard activity flag is set by activity steps 260 or 262. The logic flow then returns to the Executive Procedure.

In the example of Table 4, however, the tests of decision step 250 and 252 have been failed and decision step 270 has been entered from node 253. Decision step 270 determines whether the first scan code in the queue (the 6 make code) is a key that has been assigned an automatic hold down key function. Because the touch-type 6 key has not been assigned such a function, this test is failed and decision step 272 is entered. Keys that have been assigned automatic hold down key features are, as shown in FIG. 3A, the touch-type t key, the touch-type w key and the touch-type q key, which have ben assigned the automatic hold down key functions of Control key, Alternate Key, and Shift key, respectively. These keys conventionally require that the typist hold them down in order to achieve the desired function when a second target key is depressed. Activity step 274, decision step 276 and activity step 278 set a flag which is detected by decision step 272, that one of these automatic hold-down keys has been requested as will be further described below.

Returning to the example of Table 4, note that decision step 272 is failed because an automatic hold down key flag has not been set. Therefore, decision step 280 is executed and the first code in the queue is examined. Because the first code in the queue (the 6 make code) is a make code for a key that has been assigned a Function Keyboard key (that is to say the touch-type number 6 key has been assigned the F6 function key), decision step 280 is passed and activity step 282 is executed. As indicated in the activity column of Table 4, the 6 make code is translated into an F6 function key make code and sent to the PC by activity step 284. The queue is incremented in activity step 286, placing the 6 break code at the top of the queue as indicated in Table 4.

Decision step 288 determines if the first code in the queue is a break code. This test is included to allow auto repeating make codes (for example an auto repeating 6 make code) to be translated and sent to the PC by way of loop 289. If, however, the scan code in the queue is a break code, as in the example in Table 4, this scan code is translated into the corresponding function key break code by activity step 300 and sent to the PC by activity step 302.

Examination of the activity column shows that the F6 function key break code, which is the corresponding function key break code for the top-row 6 key break code, has been sent to the PC. The logic flow exits activity step 302 and returns to activity step 238 of FIG. 10 which increments the queue, eliminating the 6 break code and placing the f break code at the top of the queue whereupon the logic flow reenters decision step 230 at node 227.

Because the first scan code in the queue is the f break code, test 230 and 232 are failed. However, test 250 is passed because the first scan code in the queue is an f key break code. Test 256 is also passed because the f key trigger flag has been set as is indicated by the activity column in Table 4. Activity step 260 sets the Function Keyboard activity flag and the logic flow is returned to the Executive Procedure by activity step 306. Activity step 304 returns the logic flow to the Executive Procedure if the first code in the queue is a j key break code and if the j key trigger flag has been set.

Upon returning to the Executive Procedure, decision step 108 is entered and loop 157 followed without sending the f break code to the PC, as would occur if decision step 118 were entered. Note that the queue is incremented by activity step 110 leaving the queue empty as indicated in Table 4 and all activity flags are canceled by activity step 104, also indicated in Table 4. Thus, by depressing the f key and typing the 6 key before the f key is released, an F6 function key make and break code is sent to the computer, while the f codes are not. The operator has executed an F6 function key via touch-type key strokes, without having to reach for the regular F6 function key at the far left hand side of the keyboard.

EXAMPLE 2

Table 5 illustrates an example wherein one of the trigger keys, the f key, is utilized as a target key for the j trigger key. In this case, the typist wishes to send a Right Cursor Arrow signal to the computer by pressing the j trigger key 50 and typing the touch-type f key before releasing the j trigger key. The contents of the queue and the actions thereon are illustrated in Table 5.

TABLE 5

| Contents of the Queue | Activity |
|---|---|
| j make code | clear all f or j flags |

TABLE 5-continued

| Contents of the Queue | Activity |
|---|---|
| f make code | j flag set |
| f break code | |
| j break code | |
| f make code | f make code translated to Right |
| f break code | Cursor make code |
| j break code | Right Cursor make code sent to PC |
| f break code | f break code translated to Right |
| j break code | Cursor break code |
| | Right Cursor break code sent to PC |
| j break code | Function Keyboard activity flags set |
| | return to Executive Procedure |
| empty | all activity flags cleared |

In the Executive Procedure, the Function Keyboard subroutine is called at activity step 106. Any pending f or j key trigger flags are cleared by activity step 120. Because the first code in the queue is a j make code, decision step 124 is passed and the j key trigger flag is set by activity step 200. In decision step 204 it is discovered that the second scan code in the queue is an f key make code leading to decision step 208 where it is determined that the f key trigger flag has not been set. Therefore the logic flow returns to decision step 206 by way of loop 310. Decision steps 206 and 218 are failed, but decision step 222 is passed because the second scan code in the queue is a make code. Decision step 224 is also passed, because the third scan code in the queue (the f break code) is the corresponding break code of the second scan code in the queue (the f make code). Therefore, the triggering sequence for the Function Keyboard feature has been detected and the logic flow enters decision step 230 through loop 225 and node 227.

Because the queue has not yet been incremented, the first scan code in the queue is still the j make code and decision step 232 is passed. Furthermore, because the j key trigger flag has been set by activity step 200, the test in decision step 236 is satisfied and the queue is incremented by activity step 238.

The f make code is now at the top of the queue and the queue is ready to be processed by the remainder of the program. Decision step 230 is passed because the first scan code in the queue is the f key make code. Decision step 234, however, is failed because the f key trigger flag has not been set and the logic flow returns to decision step 232 which is also failed by way of loop 312.

Decision steps 250, 252, 270 and 272 are also failed, which cause the logic flow to enter decision step 280 where it is determined that the first scan code in the queue is the make code for a key that has been assigned a Function Keyboard key. That is to say, the touch-type f key has been assigned the function of the Right Cursor Arrow Key. Therefore, the f make code is translated into a corresponding Right Cursor make code and sent to the PC according to activity steps 282 and 284 and as indicated in the activity column of Table 5.

The queue is incremented by activity step 286 the f break code at the top of the queue.

the first scan code in the queue is a break code, decision step 288 causes the logic flow to enter activity step 300 which translates the f break code into a Right Cursor break code and sends the code to the PC in activity step 302. From activity step 302, loop 239 is entered and the queue is incremented at activity step 238 placing the j break code at the top of the queue. The logic flow enters decision step 230 from node 227 whereupon decision steps 230, 232 and 250 are failed.

In decision step 252 it is determined that the first scan code in the queue is the j key break code and because the j key trigger flag has been set in activity step 200, decision step 258 causes the Function Keyboard activity flag to be set by activity step 262 as indicated in Table 5 and the logic flow returns to the Executive Procedure by activity step 304.

In the Executive Procedure, decision step 108 causes the logic flow to enter loop 157 because the Function Keyboard activity flag has been set and the queue is incremented by activity step 110. This leaves the queue empty as indicated in Table 5. Note that the only codes sent to the computer were the Right Cursor make code followed by the Right Cursor break code. The f trigger key 52 was recognized as a target key because of the flag setting arrangement in the Function Keyboard subroutine.

In Table 6, a third example of the Function Keyboard feature is illustrated wherein the typist wishes to touch type the command sequence "Alternate-F5." Conventionally, the typist would hold down the Alternate key 32, type function key F5 (area 44), then release the Alternate key 32. Instead, the typist depresses the j trigger key 50, and while holding down the j trigger key, types (depresses and releases) the letter w key, and the touch-type (top-row) number 5 key. The contents of the queue, and the activities taken by the Function Keyboard subroutine, are shown in Table 6.

TABLE 6

| Contents of the Queue | Activity |
|---|---|
| j make code | any pending f or j key trigger flags canceled |
| w make code | |
| w break code | j key trigger key set |
| 5 make code | |
| 5 break code | |
| j break code | |
| w make code | |
| w break code | |
| 5 make code | |
| 5 break code | |
| j break code | |
| w break code | Alternate key flag set |
| 5 make code | |
| 5 break code | |
| j break code | |
| 5 make code | Alternate key make code sent to PC |
| 5 break code | |
| j break code | 5 make code translated to F5 function key make code and sent to PC |
| 5 break code | 5 break code translated to |
| j break code | Function Key F5 break code and sent to PC |
| | Alternate key break code sent to PC |
| | Alternate key flag canceled |
| j break code | Function Keyboard activity flag set |
| | return to Executive Procedure |
| empty | all activity flags canceled (j trigger key flag will be canceled on next pass through Function Keyboard subroutine) |

Upon first entering the Function Keyboard subroutine activity, step 120 clears any pending f or j trigger key flags. THe j make code at the top of the queue is recognized by decision step 124, and the j key trigger flag is set by activity step 200. THe second code in the queue, the w make code, is recognized at decision step 222, and the third scan code in the queue, the w break code, is recognized as the corresponding break code of the second scan code in the queue by decision step 224. Thus, the triggering sequence having been detected, the logic flow enters decision step 230 at node 227 by way of loop 225. The j make code at the top of the queue is recognized by decision step 232 and because the j trigger flag has been set, the queue is incremented by decision step 238 to eliminate the j make code form the top of the queue.

The w make code is now at the top of the queue and is recognized in decision step 270 as having been assigned an automatic hold down key. The assigned key is the Alternate Key. Activity step 274 increments the queue, eliminating the w make code from the top of the queue and placing the w break code thereat. In decision step 276 it is recognized that the first scan code in the queue is a break code for a key that has been assigned an automatic hold-down key. Activity step 278 sets an appropriate automatic hold-down key flag according to this break code. As indicated in the activity column of Table 6, the Alternate Key flag is set. Loop 239 is entered and the queue is incremented by activity step 238. Thus, the first series of target codes have been eliminated from the stack. They are no longer needed because the appropriate flag for this automatic hold-down key has been set.

The 5 make code is now at the top of the queue and the logic flow is at node 227 of Function Keyboard subroutine. Decision steps 230, 232, 250, 252 and 270 are failed leading to decision step 272 where it is recognized that an automatic hold-down key flag (the Alternate Key flag) has been set. Activity step 400 sends the automatic hold-down key make code indicated by the flag (the Alternate Key make code) to the PC. The first scan code in the queue (the 5 make code) is translated into the corresponding function key make code (the F5 function key make code) by activity step 402 and sent to the PC by activity step 404.

The queue is incremented by activity step 406 which places the 5 break code at the top of the queue. Decision step 408 is passed because the first scan code in the queue is a break code. Failure of this test would cause the logic flow to enter loop 409 which handles multiple target key make codes entered by auto repeating of the second series target make codes. In this case the touch-type number 5 key has not been held down long enough to begin auto-repeating and activity step 410 translates the 5 break code into an F5 function key break code and the F5 function key break code is sent to the PC by activity step 412. The Alternate Key break code is then sent to the PC by activity step 414. The Alternate Key flag is canceled by activity step 416. The logic flow enters loop 239, whereupon the queue is incremented by activity step 238, placing the j trigger key break code at the top of the queue and the logic flow at node 227.

The j key break code is recognized by decision step 252 whereupon decision step 258 recognizes that the j key trigger flag has been set. Activity step 262 sets the Function Keyboard activity flag, as indicated in Table 6, and activity step 304 returns the logic flow to the Executive Procedure, also as indicated by the activity column in Table 6.

Upon return to the Executive Procedure, decision step 108 recognizes that the Function Keyboard activity flag has been set and the queue is incremented by activity step 110 which leaves the queue empty. The Function Keyboard activity flag will be canceled by activity step 104. Also, the pending j trigger key flag will be canceled on the next iteration of the Function Keyboard subroutine.

Thus, as the above example illustrates, a typist can touch type an Alternate-F5 request completely on the keyboard touch-type keys.

EXAMPLE 4

It is often desirable to request an automatic hold-down key such as the Alternate key wherein the object (target) of the Alternate key is a non-translated key. An example of this would be the "Alternate-t" command sequence. Conventionally, this sequence would be typed by first holding down the Alternate key 32, typing the letter t, then releasing the Alternate key 32. Instead, the typist can touch-type this command sequence by first holding down the j trigger key 50, typing the letter w, and then releasing the j trigger key. If the letter t is then typed, an "Alternatet" command sequence will be sent to the computer. Table 7 illustrates an example of this sequence.

TABLE 7

| Contents of the Queue | Activity |
|---|---|
| j make code | j trigger key flag set |
| w make code | |
| w break code | |
| j break code | |
| t make code | |
| t break code | |
| w make code | |
| w break code | |
| j break code | |
| t make code | |
| t break code | |
| w break code | Alternate key flag set |
| j break code | |
| t make code | |
| t break code | |
| j break code | Function Keyboard activity flag set |
| t make code | |
| t break code | |
| t make code | Function Keyboard activity flag canceled |
| t break code | |
| | Alternate key make code sent to PC |
| | t make code sent to PC |
| t break code | t break code sent to PC |
| | Alternate key break code sent to PC |
| | Alternate key flag cnceled |
| empty | |

The j key trigger flag is set at activity step 200 and the sequence j trigger key make code, w key make code, corresponding w key break code, is recognized by the Function Keyboard subroutine at decision step 224 as the triggering sequence for the Function Keyboard feature. The logic flow leaves decision step 224 by way of loop 225 and enters decision step 230 through node 227.

The j trigger key make code is recognized by decision step 232 and because the j key trigger flag has been set, decision step 236 causes the logic flow to enter loop 239 and the j key make code is eliminated by incrementing the queue at decision step 238. This places the w key make code at the top of the queue and the logic flow at node 227 of the Function Keyboard subroutine. The w key make code is recognized by decision step 270 because it is the first scan code in the queue and it is a make code for a key that has been assigned an automatic hold-down key. Specifically, the w key has been assigned the Alternate automatic hold-down key. Activity step 274 increments the queue so that decision step 276 can examine the w break code and determine that the w break code is a break code for a key that has been assigned an automatic hold-down key, namely the Alternate key. Therefore, the Function Keyboard subroutine has determined that the target series in the queue represents an automatic hold-down key and activity step 278 sets the appropriate automatic hold-down key flag, namely the Alternate key flag according to the w break code which is at the top of the queue. Activity step 38 increments the queue to eliminate the w break code so that the remainder of the queue can be analyzed by the program.

The j trigger key break code is now at the top of the queue and the logic flow is at node 227 of the Function Keyboard subroutine. The j trigger key break code is recognized at decision step 252 and decision step 258 recognizes that the j key trigger flag has been set. Therefore, activity step 262 sets the Function Keyboard activity flag and the logic flow is returned to the Executive Procedure by activity step 304.

In the Executive Procedure, decision step 108 recognizes that the Function Keyboard activity flag has been set and activity step 110 increments the queue placing the t make code at the top of the queue. The Function Keyboard activity flag is canceled by activity step 104. Upon reentering the Function Keyboard subroutine, decision steps 122 and 124 are failed causing the logic flow to enter decision step 126. Because the Alternate Key flag has been set and not yet canceled, decision step 126 sends the logic flow to activity step 600 in FIG. 7.

In activity step 600, an Alternate Key make code is sent to the PC. The type of automatic hold-down key make code is determined according to the type of automatic hold-down key flag that has been set. The first code in the queue, the t make code, is sent to the PC by activity step 602. The queue is incremented in activity step 604, placing the t key break code at the top of the queue. Because the first code in the queue is a break code, decision step 606 causes the logic flow to enter activity step 608. If, however, the first code in the queue had been a make code, loop 609 would have caused the make code to be sent to the PC Loop 609 is included to handle multiple make codes in this second target code series which may be due to auto repeating of the second target key make code. In this example, however, auto repeating of the t make code has not occurred and activity step 608 sends the t break code to the PC. Activity step 610 sends the selected automatic hold-down key break code, (the Alternate key break code) to the PC and activity step 612 cancels the Alternate Key flag.

Activity step 614 causes the logic flow to reenter the Executive Procedure whereupon test 108 is failed because the Function Keyboard activity flag has been canceled in the last iteration through the Executive Procedure. Therefore, activity step 112 sends the logic flow to the Space Bar Control Key subroutine, which is illustrated in FIGS. 5 and 6.

Remembering that the t break code is still at the top of the queue, it is apparent that decision step 130 will fail because the first code in the queue is not a space bar make code. Activity step 132 causes the logic flow to reenter the Executive Procedure and enter decision step 114. Because the Space Bar Control Key activity flag has not been set, activity step 118 is executed and the t break code at the top of the queue is sent to the PC. The logic flow then enters loop 157 whereupon the queue is incremented by activity step 110, which leaves the queue empty. Note that the sequence of keys typed by the typist has resulted in an Alternate key make code, a t make code, a t break code and an Alternate key break code being sent to the computer just as if the nontouch-type Alternate key 32 had been held down while the touch-type t key was pressed and released.

It will be appreciated from the discussion of the previous examples and reflection upon the logic diagrams shown in FIGS. 6 and 7 that normal typing, including overlapping letters and spaces or overlapping spaces and letters, will be passed from the keyboard to the computer unaffected by the Function Keyboard subroutine Specifically, decision steps 222 and 500, in FIG. 6, test for the presence of the triggering sequence which is necessary to enter the remainder of the Function Keyboard subroutine Activity steps 502 and 504, respectively, return the logic flow to the Executive Procedure so that these normal typing sequences can be sent to the computer by activity step 118 in the Executive Procedure Decision step 500 tests for the presence of the auto-repeat triggering sequence trigger make code, target make code and second target make code where the third code in the memory is an auto-repeat target make code If this second triggering sequence is detected, then the logic flow enters the rest of the function keyboard subroutine.

From the foregoing it will be furthermore appreciated that other variations of the preferred embodiment herein disclosed are contemplated and considered to be part of the invention. For example, although the logical detection steps for determining the presence of a triggering sequence have been executed as a computer program in a digital microcomputer, execution of the logic in a system utilizing discrete devices is considered to be part of the invention. Further yet, it will be appreciated that the memory means for receiving the keyboard key codes, the means for detecting the presence of the triggering sequence, the means for translating some of the codes into different codes and for sending the translated codes to the computer can easily be incorporated into the programming of the computer itself and is considered to be part of the invention. Therefore, the scope of the invention is not to be limited by the above description, but is to be determined in scope by the claims which follow.

We claim:

1. A computer keyboard enhancing device for use with a computer having a keyboard with touch-type keys, including a space key, wherein the keyboard produces a make code when a key is depressed and a break code when a key is released, the device permitting the use of at least one touch-type key, referred to as a trigger key, to perform a different function than it normally performs, when a second key, referred to as a target key, is depressed and released in a selected relationship to depression of the trigger key, the device comprising processing means coupled to the keyboard and to the computer, the processing means including:

receiving means for receiving the make and break codes produced by the keyboard in response to keys being respectively depressed and released;

detection means coupled to the receiving means for detecting a sequence of received codes serially including a trigger key make code, a target key make code and a corresponding break code of the target key make code, and for producing an indication that said sequence has been detected, the indication being produced upon receipt of said corresponding break code, said indication indicating that the target key has been depressed and released while the trigger key was held depressed; and transmitting means coupled to the receiving and detection means for transmitting the received codes to the computer when said indication has not been produced and for transmitting modified codes to the computer when said indication has been produced, so that the trigger key performs a function other than its normal function when the target key is depressed and released while the trigger key is held depressed.

2. The device of claim 1, for use with a keyboard that includes a control key, wherein the trigger key is the space key, and wherein said sequence comprises a space key make code, the target key make code, and the target key break code, and wherein the modified codes comprise the control key make code, the target key make code, and the target key break code.

3. The device of claim 1, wherein the target key is a touch-type key, and wherein the modified codes comprise a make code for a new target key followed by the break code for the new target key.

4. The device of claim 3, for use with a keyboard that includes non-touch-type keys in addition to the touch-type keys, wherein the new target key is a non-touch-type key to permit touch-typing of non-touch-type keys.

5. The device of claim 4, wherein each of a plurality of different target keys has a new, non-touch-type target key associated therewith.

6. The device of claim 3, having two trigger keys other than the space key, each trigger key having associated, different make and break codes which are generated by the processing means when said indication is produced, and wherein the processing means includes means for producing a second indication indicating to the detection means that the second trigger key is being used as a target key if the first trigger key is depressed and held depressed while the second trigger key is depressed and released.

7. The device of claim 3, wherein the computer is of the type which recognizes hold-down key make and break codes which cause the computer to perform a function only if a different make code is received immediately after a hold-down key make code and before a hold-down key break code, wherein said sequence of received codes detected by the detection means serially includes the hold-down key make code, make and break codes for a first target key and make and break codes for a second target key, and wherein the modified codes comprise a make code for the hold-down key, a make code and a break code for a key different from the target keys, and the hold-down key break code, to allow a hold-down key to be touch-typed.

8. The device of claim 1 wherein the computer is of the type having a separate keyboard, electronically connected to the computer by an external cable having connectors at both ends, the device further comprising a case enclosing a microcomputer having onboard ROM, RAM and a central processing unit wherein the detection means, and transmitting means are stored as program steps in the ROM and executed in the processor unit, the housing having means for operatively connecting the device between the keyboard and computer, respectively, the connecting means having a reset line and a ground line for connecting the keyboard directly to the computer, a clock line for transmitting clock signals form the computer to the microcomputer and from the microcomputer to the keyboard, a serial data transmission line for transmitting make and break codes from the keyboard keys to the microcomputer and from the microcomputer to the computer, and a power line for connecting the keyboard to the computer and to the microcomputer.

9. The device of claim 8 including means for detecting the direction in which the device is connected between the keyboard and computer and for indicating the direction to the microcomputer so that the microcomputer can assign the correct ends of the ground and serial data transmission line to the keyboard and computer, respectively.

10. A computer keyboard enhancing device for use with a computer having a keyboard with touch-type keys, including a space key, wherein the keyboard produces a make code when a key is depressed and a break code when a key is released, and has an automatic key repeating feature which sends additional make codes to the computer if a key remains depressed for a predetermined time, the device permitting at least one touch-type key, referred to as a trigger key, to perform a different function than it normally performs when a second key, referred to as a target key, is depressed and released in a selected relationship to depression of the trigger key, the device comprising processing means coupled to the keyboard and to the computer, the processing means including:

receiving means for receiving the make and break codes produced by the keyboard in response to keys being respectively depressed and released;

detection means coupled to the receiving means for detecting a sequence of received codes serially including a trigger key make code and at least two sequential target key make codes, and for producing an indication that said sequence has been detected, the indication being produced upon receipt of said target at last two key make codes, the sequential target key make codes indicating that the target key has been depressed and automatic repeating of the target key begun while the trigger key was held depressed; and transmitting means coupled to the receiving and detection means for transmitting the received odes to the computer when said indication has not been produced and for transmitting modified codes to the computer when said indication has been produced, so that the trigger key performs a function other than its normal function when a target key is held depressed while the trigger key is held depressed.

11. The device of claim 10, for use with a keyboard that includes a control key, wherein the trigger key is the space key, and wherein said sequence comprises a space key make code, a plurality of target key make codes, target key make code, and a target key break code, and wherein the modified codes comprise the control key make code, a corresponding plurality of target key make codes, and the target key break code.

12. A machine inplemented method for enhancing a keyboard used with a computer, the keyboard including touch-type keys including a space key, wherein the keyboard produces a make code when a key is depressed and a break code when a key is released, the method permitting the use of at least one touch-type key, referred to as a trigger key, to perform a different function than it normally performs, when a second key, referred to as a target key, is depressed and released in a selected relationship to depression of the trigger key, the method comprising the steps of:

receiving the make and break codes produced by the keyboard in response to keys being respectively depressed and released;

detecting a sequence of codes serially including a trigger key make code, a target key make code, and a corresponding break code of the target key make code, and producing an indication that said sequence has been detected, the indication being produced upon receipt of said corresponding break code, said sequence indicating that a target key has been depressed and released while a trigger key was held depressed; and when said sequence has been detected, transmitting modified codes to the computer transmitting the received codes to the computer.

13. The method of claim 12, wherein the sequence detected in the detecting step includes a trigger key break code after the target key break code.

14. The method of claim 13, wherein the trigger key is the space key, and the modified codes comprise the control key make code, the target key make code, and the target key break code.

15. The method of claim 13, wherein the target key is a touch-type key, and wherein the modified codes comprise a make code for a new target key, followed by the break code for the new target key.

* * * * *